United States Patent [19]

Paoli

[11] Patent Number: 5,200,969
[45] Date of Patent: Apr. 6, 1993

[54] SWITCHABLE MULTIPLE WAVELENGTH SEMICONDUCTOR LASER

[75] Inventor: Thomas L. Paoli, Los Altos, Calif.
[73] Assignee: Xerox Corporation, Stamford, Conn.
[21] Appl. No.: 779,211
[22] Filed: Oct. 18, 1991
[51] Int. Cl.[5] .............................................. H01S 3/10
[52] U.S. Cl. ........................................ 372/50; 372/20; 372/45; 372/46
[58] Field of Search ...................... 372/46, 45, 50, 26, 372/20

[56] References Cited

U.S. PATENT DOCUMENTS

| | | | |
|---|---|---|---|
| 4,802,182 | 1/1989 | Thornton | 372/50 |
| 4,817,110 | 3/1989 | Tokuda et al. | 372/45 |
| 4,839,899 | 6/1989 | Burnham et al. | 372/45 |
| 4,882,734 | 11/1989 | Scifres et al. | 372/45 |
| 4,893,353 | 1/1990 | Iwaoka et al. | 455/612 |
| 4,912,526 | 3/1990 | Iwaoka et al. | 455/612 |
| 4,982,408 | 1/1991 | Shimizu | 372/45 |
| 4,987,468 | 1/1991 | Thornton | 357/34 |
| 5,048,040 | 9/1991 | Paoli | 372/50 |
| 5,060,235 | 10/1991 | Ikeda | 372/45 |

OTHER PUBLICATIONS

Aiki et al., *Frequency Multiplexing Light Source with Monolithically Integrated Distributed-Feedback Diode Lasers*, Appl. Phys. Lett., vol. 29, No. 8, p. 506 (1976).
Holonyak et al., *Quantum-Well Heterostructure Lasers*, IEEE J. Quant. Elec., vol. QE-16, No. 2, p. 170, (1980).
Epler et al., *Broadband Tuning ($\Delta E \sim 100$ meV) of $Al_x Ga_{1-x}As$ Quantum Well Heterostructure Lasers With An External Grating*, Appl. Phys. Lett., vol. 43, No. 8, p. 740 (1983).
Tokuda et al., *Emission Spectra of Single Quantum Well Lasers With Inhomogeneous Current Injection*, J. Appl. Phys., vol. 64, No. 3, p. 1022 (1988).
Tokuda et al., *Lasing Wavelength Of An Asymmetric Double Quantum Well Laser Diode*, Appl. Phys. Lett., vol. 51, No. 4, p. 209 (1987).
Ikeda et al., *Asymmetric Dual Quantum Well Laser-Wavelength Switching Controlled By Injection Current*, Appl. Phys. Lett., vol. 55, No. 12, p. 1155 (1989).
Fang et al., *Longitudinal Mode Behavior and Tunability of Separately Pumped (GaAl)As Lasers*, Appl. Phys. Lett., vol. 44, No. 1, p. 13 (1984).
Y. Arakawa and A. Yariv, *Theory of Gain, Modulation Response, and Spectral Linewidth in AlGaAs Quantum Well Lasers*, IEEE J. Quant. Elec., vol. QE-21, No. 10, p. 1666 (1985).
Asada et al., *Gain and the Threshold of Three-Dimensional Quantum-Box Lasers*, IEEE J. Quant. Elec., vol. QE-22, No. 9, p. 1915 (1986).
R. M. Kolbas and N. Holonyak, Jr., *Man-Made Quantum Wells: A New Perspective on the Finite Square-well Problem*, Am. J. Phys., vol. 52, No. 5, p. 431 (1984).
H. C. Casey and M. B. Panish in "Heterostructure Lasers: Part A", p. 193 (Academic Press, 1978).
J. Z. Wilcox et al., *Dependence of Emission Wavelength on Cavity Length and Facet Reflectivities in Multiple Quantum Well Semiconductor Lasers*, Appl. Phys. Lett., vol. 54, No. 22, p. 2174 (1989).
Stern et al., *Fabrication of 20-nm Structures in GaAs*, Appl. Phys. Lett., vol. 45, No. 4, p. 410 (1984).
Scherer et al., *Fabrication of Microlasers and Microresonator Optical Switches*, Appl. Phys. Lett., vol. 55, No. 26, p. 2724 (1989).
Simhony et al., *Double Quantum Wire GaAs/AlGaAs Diode Lasers Grown By Organometallic Chemical Vapor Deposition On Grooved Substrates*, IEEE Phot. Tech. Lett., vol. 2, No. 5, p. 305 (1990).

Primary Examiner—James W. Davie

[57] ABSTRACT

A multiple wavelength semiconductor laser includes a plurality of layers, one or more of said layers comprising a carrier confinement (multiple quantum well) active region of the type wherein at least two confining regions (quantum wells) contained in the active region are formed such that one quantum level of a first region (quantum well) is at the same energy level as a different quantum level of a second region (quantum well). This alignment of the quantum levels between two confinement regions (quantum wells) results in the recombination of carriers from one region augmenting the recombination of carriers from the other region, the net effect being an output intensity at both shorter and longer wavelengths of operation more nearly equal than heretofore available. Appropriate placement of the regions within the laser waveguide also facilitates a matching of the output intensity profile with a desired output mode, e.g., the fundamental mode TE00.

6 Claims, 15 Drawing Sheets

SWITCHABLE MULTIPLE WAVELENGTH SEMICONDUCTOR LASER

BACKGROUND OF THE INVENTION

The present invention relates generally to semiconductor lasers and more specifically to a semiconductor laser structure which coaxially emits light at two or more different wavelengths, whose active regions are appropriately structured to provided gain augmentation at a selected output wavelength or wavelengths.

Semiconductor lasers, also referred to as solid state lasers or diode lasers, are well known in the art. These devices are based on the p-n junction from semiconductors, and quantum electronics from lasers. The devices generally consist of a layered semiconductor structure having one or more active layers sandwiched between cladding layers and bounded at their ends by cleaved facets which act as semitransparent mirrors. An optical resonator, or so-called Fabry-Perot cavity is thereby formed. An electrical potential is applied across the one or more active layers. The voltage drives either holes or electrons or both across the p-n junction (i.e., they are "injected"), and when these carriers recombine they emit light. Optical feedback caused by internal reflection from the cleaved facets allows "stimulation" of the recombination to provide coherent emission.

As a general rule, a semiconductor laser of this type emits coherent light at a single wavelength, which is a function primarily of the semiconductor material in the laser's light emitting region. This single wavelength emission is sufficient for many applications, such as communication systems, laser xerography, and other applications where the device's small size, low operating current, and other characteristics are beneficial. However, there are a number of applications where it is necessary or desirable to be able to select or tune the output wavelength of the laser to one of two or more possible output wavelengths during operation of the laser. Furthermore, in certain circumstances, some tuning of the output wavelength of the laser may be required to optimize its applicability. This is due in part to the fact that it is not possible to know precisely what the predominant emission wavelength will be in the wavelength gain spectrum of the laser.

A number of laser structures have been suggested which allow multiple wavelength emission. Of these there are basically two type—coaxial and separate source lasers. A coaxial laser is one capable of emitting, either separately or simultaneously, two different wavelengths from the same point in a single layer. Emanation is in the form of a beam which, for both wavelengths, is along the same longitudinal axis and which may be imaged to a single spot at any distance from the laser structure. A separate source laser is one which emits at two or more different wavelengths, either separately or simultaneously, each wavelength emanating from a different point in the structure (such as from separate layers such as disclosed in U.S. Pat. No. 5,048,040, which is incorporate by reference herein; see also co-pending U.S. patent application Ser. No. 07/579,218, filed Sep. 5, 1990 (commonly assigned), which is also incorporated by reference herein). The outputs of separate source lasers have also been combined external to the laser cavity to form a single beam in which the outputs of different wavelength are made approximately coaxial. See, Aiki et al., *Frequency Multiplexing Light Source with Monolithically Integrated Distributed-Feedback Diode Lasers*, Appl. Phys. Lett., vol. 29, no. 8, p. 506 (1976). As will become apparent, coaxial multiple wavelength lasers are of primary concern herein, although the present invention may find applicability in separate source lasers.

Furthermore, the present invention is most applicable to quantum-well heterostructure lasers. Typically, a quantum-well heterostructure laser consists of, inter alia, a substrate upon which is formed or deposited a cladding layer, an active layer, another cladding layer, and appropriate electrical contacts to the various layers. Waveguiding layers may also be incorporated into the structure where appropriate. Commonly, these structures are comprised of active layers of GaAs, cladding layers of $Al_xGa_{1-x}As$, where $0 \leq x \leq 1$, and where employed, waveguiding layers of $Al_yGa_{1-y}As$, where $0 \leq y \leq 1$ and $y < x$. There are two primary types of quantum-well heterostructure lasers, those whose active layer is comprised of a single quantum-well (SQW) and those whose active layer is comprised of multiple quantum-wells (MQW). As will become clear from the following description, the latter, MQW laser, is most relevant to the present invention.

It is known that the total energy $E_T$ of a charge carrier (e.g., an electron) in the quantum well is composed of its energy in the three orthogonal directions x, y, and z, and can therefore be written as $$E_T = E_x + E_y + E_z \tag{1}$$

where $E_i$ is the carrier energy in the ith direction relative to the energy at the bottom of the well. For the direction normal to the plane of the quantum well layer, denoted herein by z, the thickness of the semiconductor layer in which the carrier is confined is on the order of the carrier de Broglie wavelength ($\lambda = h/p$, where h is Planck's constant and p is carrier momentum). For layers of this thickness one-dimensional quantization occurs thereby restricting the carrier's energy $E_z$ to discrete values $E_n$ with $n = 1, 2, 3, \ldots$. These levels (referred to herein as "quantum levels") are typically illustrated by a bound-state diagram such as that shown in FIG. 1 for a $GaAs/Al_xGa_{1-x}As$ quantum well structure. See, e.g., Holonyak et al., *Quantum-Well Heterostructure Lasers*, IEEE J. Quant. Elec., vol. QE-16, no. 2, p. 170, (1980). The active layer having quantized states is essentially an energy "well" whose depth is a function of the bandgap of the active layer material and whose width is equal to the thickness of the active layer. FIG. 1 diagrams a single quantum well structure. However, by forming the active layer to have a number of bandgap changes, for example, multiple quantum wells may be formed.

In many applications, the motion of the individual carriers in the x and y directions is allowed over distances much larger than the de Broglie wavelength and therefore is not quantized. In these nonquantized semiconductor layers, the energy components for the x and y directions are given by $$E_x = p_x^2/2m_e \tag{2}$$

and $$E_y = p_y^2/2m_e \tag{3}$$

where $m_e$ is the effective mass of the electron and $p_i$ is the component of the electron momentum in the ith direction. In certain applications, such as so-called quantum wire devices, motion in one or both of the x and y directions may be restricted such that quantum size effects occur. For a discussion of this type of device see U.S. Pat. No. 5,138,625 and incorporated by reference herein.

Carriers (e.g., electrons) are injected into the active layer with sufficiently high energy that they enter the conduction band with excess energy. It is known as a general feature of semiconductors that carriers injected into a layer at an initial energy level rapidly scatter downward in energy (thermalize) to ultimately occupy the unfilled energy state with lowest energy. Thus, electrons injected into the quantum well rapidly settle to the lowest energy states in the conduction band, i.e., states whose total energy, given by $$E_T = p_x^2/2m_e + p_y^2/2m_e + E_1 \quad (4)$$

is a minimum, where $E_1$ is the lowest energy state in the z direction (i.e., the first quantum level). Note that the total energy in the quantum well can not be less than $E_1$ due to the energy quantization. As the number of carriers in the quantum well is increased, electron states at increasingly higher energies are occupied as $p_x^2/2m_e + p_y^2/2m_e$ increases. If the density of the injected carriers increases sufficiently, the total energy $E_T$ given by equation (4) becomes equal to $E_2$, allowing carriers to occupy states at the next highest quantum level. This process of progressively filling unoccupied states of increasing energy is called "bandfilling" because the conduction band is filled with the increasing number of electrons and the valence band is filled with the increasing number of holes. Increasing the number of carriers further will eventually fill states with energy greater than $E_2$ and thereby allow carriers to occupy states at the third quantum level $E_3$ and so on. Similar bandfilling occurs with holes in the valence band.

When an electron in the conduction band and a hole in the valence band recombine they radiate their energy in the form of light. In a typical solid state laser, part of this light energy is emitted, while part is absorbed in the active layer. Part of the absorbed energy increases the carrier concentrations in the conduction and valence bands by photogeneration of electrons and holes. When more electrons and holes recombine than are created by absorbed light, the quantum well is said to have optical gain. When the gain of the quantum well is equal to the loss of the resonator, a point referred to as "threshold," the device begins to lase.

The wavelength of the light emitted in recombination is a function of the energy given up in recombination, as given by $$\lambda(\text{Å}) = \frac{12398}{E(\text{eV})} \quad (5)$$

When the level of carrier injection is relatively low (but above threshold) laser oscillation of wavelength $\lambda_1$ corresponding to the recombination of carriers in quantum level $E_1$ will occur in the resonator. If lasing in quantum level $E_1$ is prevented while simultaneously increasing the injected current, the quantum well layer will bandfill, allowing carriers to occupy the second quantum level $E_2$. When the injected current is increased sufficiently, laser oscillation of wavelength $\lambda_2$ occurs.

A number of efforts have been undertaken to use bandfilling in SQW and MQW devices to obtain coaxial multiple wavelength emission. For example, Epler et al., in *Broadband Tuning* ($\Delta E \sim 100$ meV) *of $Al_{1-x}Ga_{1-x}As$ Quantum Well Heterostructure Lasers With An External Grating*, Appl. Phys. Lett., vol. 43, no. 8, p. 740 (1983) describe a bandfilled SQW diode laser tuned by a grating between wavelengths corresponding to the n=1 and n=2 transitions. Tokuda et al., in *Emission Spectra of Single Quantum Well Lasers With Inhomogeneous Current Injection*, J. Appl. Phys., vol. 64, no. 3, p. 1022 (1988), describe a split contact SQW laser which, by way of bandfilling, can provide gain over a large spectral region. Also, Tokuda et al., in *Lasing Wavelength of An Asymmetric Double Quantum Well Laser Diode*, Appl. Phys. Lett., vol. 51, no. 4, p. 209 (1987), describe bandfilling of a tailored double quantum well structure allowing the selection of the wavelength output from six possible allowed transitions. (N.B., lasing at each and every transition originates in both wells.) Ikeda et al., in *Asymmetric Dual Quantum Well Laser-Wavelength Switching Controlled By Injection Current*, Appl. Phys. Lett., vol. 55, no. 12, p. 1155 (1989) described use of the lowest energy levels in two wells of different composition to provide emission at two different wavelengths.

Efforts have also been undertaken to control, or tune, the output between one of two possible wavelengths. For example, Fang et al., in *Longitudinal Mode Behavior and Tunability of Separately Pumped (GaAl)As Lasers*, Appl. Phys. Lett., vol. 44, no. 1, p. 13 (1984) describe a laser structure having a separately contacted modulator region along the axis of the laser cavity allowing changing the carrier concentration, and hence the output wavelength over a limited range. Iwaoka et al., in U.S. Pat. No. 4,893,353, dated Jan. 9, 1990 and U.S. Pat. No. 4,912,526, dated Mar. 27, 1990 discuss varying the operating temperature of the laser in order to switch between various output wavelengths.

All of the above approaches suffer from a common disadvantage in that, as the laser is switched or shifted toward a shorter wavelength of operation the output intensity decreases. In order to compensate for this intensity decrease, the laser is often operated at an increased current. While this does allow an increase in output intensity, it also puts demands on the current source, increases heat generation resulting in degraded efficiency of operation, increases strain on the structure leading to shortened lifespan (similar also to the drawbacks of the thermal modulation discussed above), the large difference between the thresholds of the long and short wavelengths introduces large thermal transients when the wavelength is switched, etc.

In order to increase the output intensity of single frequency lasers it has been suggested that all of the wells of a multiple quantum-well laser be structured identically so that the quantum levels of all of the wells are aligned at the same energy bandgap. See Y. Arakawa and A. Yariv, *Theory of Gain, Modulation Response, and Spectral Linewidth in AlGaAs Quantum Well Lasers*, IEEE J. Quant. Elec., vol. QE-21, no. 10, p. 1666 (1985). In this way, the output of each of the wells acts in conjunction at the same wavelength to thereby increase the gain of the laser. No disclosure or suggestion is made as to compensation for the intensity drop in multiple wavelength lasers.

Additional disadvantages of various of the above-described methods and apparatus include: temperature cycling resulting from or required to vary the output wavelength accelerates the degradation of the performance of the laser, often to the point where the lifespan of the laser is significantly shortened; a number of the methods and apparatus are not adaptable to wavelength tuning during operation of the device (that is, once the diffraction grating is placed in the laser beam path it is not possible to practically and accurately adjust or change the grating or filter to alter the wavelength fed back to the laser); it is very difficult if not impossible to accurately heat only one laser of an array of lasers without affecting the neighboring lasers (this is also an issue when operating the laser in close proximity to other devices, such as transistors, when operating the laser in a small-scale integrated system); and, a number of the methods and apparatus require additional apparatus and control, for example to vary the laser's temperature.

There is a present need in the art for a coaxially emitting multiple wavelength laser capable of increased output intensity, especially at the higher output frequencies, which at the same time minimizes any increase in threshold current for the higher output frequencies. There is also an alternative need to be able to operate the multiple wavelength laser with a minimal but nonzero difference between the thresholds of the longest and shortest wavelengths of operation. Also needed in the art are lasers able to operate simultaneously on two widely separated wavelengths. Finally, it is desirable to be able to provide a multiple wavelength laser with improved matching of the internal optical gain to the fundamental (gaussian) laser mode $TE_{00}$. As will be described below, various aspects of the present invention address these needs.

SUMMARY OF THE INVENTION

The present invention advances the state of the art by providing a multiple wavelength diode laser source having output intensity at both the shorter and longer wavelengths of operation more nearly equal than heretofore available. At the heart of the present invention is the structuring of the quantum wells of a multiple quantum well active layer so as to align the energy bands of different energy band number of at least two adjacent quantum wells.

The structure of the diode laser source of this invention comprises a MQW active layer disposed between upper and lower cladding layers. At least two quantum wells are formed in the active layer, a shallow well and a deep well. The shallow well is formed to have at least one energy band confined thereto, and the deep well is formed to have at least two energy bands confined thereto. The depth, thickness, and material composition of the shallow well and the deep well are selected such that the first energy band of the shallow well is at the same energy level as the second energy band of the deep well. Alternatively, the alignment may be between the first energy band of the shallow well and a third energy band of the deep well, the second energy band of the shallow well and the third energy band of the deep well, etc., again based on the depth, thickness, and material composition of the wells. The alignment of the energy bands allows the recombination of carriers from the deep well to augment the recombination of carriers from the shallow well. Since recombination in each energy band corresponds to a unique output wavelength, the alignment of the energy bands allows increased gain for the output wavelength corresponding to the aligned energy band (e.g., the wavelength corresponding to the first energy band of the shallow well).

The number of wells, and the selected alignment of the quantum levels, determines the output intensity profile. Appropriate placement of the wells within the laser waveguide thus facilitates a matching of the output intensity profile with a desired output mode, e.g., the fundamental mode $TE_{00}$. Uniform band filling is achieved by tunneling between wells or by simultaneous injection into all wells.

The present invention extends to application in two dimensionally quantized structures ("quantum wires") and three dimensionally quantized structures ("quantum dots"). In these cases, the quantized regions may be designated by two or three quantum numbers, respectively, and the present invention is realized where at least one of the quantum numbers differ as between two regions with aligned energy bands.

The scope of the present invention and the manner in which it addresses the problems associated with prior art methods and apparatus will become more readily apparent from the following detailed description when taken in conjunction with the accompanying drawings and claims.

BRIEF DESCRIPTION OF THE DRAWINGS

FIG. 9b illustrates the gain enhancement obtained from an active layer containing multiple quantum wells formed according to this invention.

In general, like reference numerals will be used to denote like elements as between each of the aforementioned figures.

DETAILED DESCRIPTION

Figure 1:
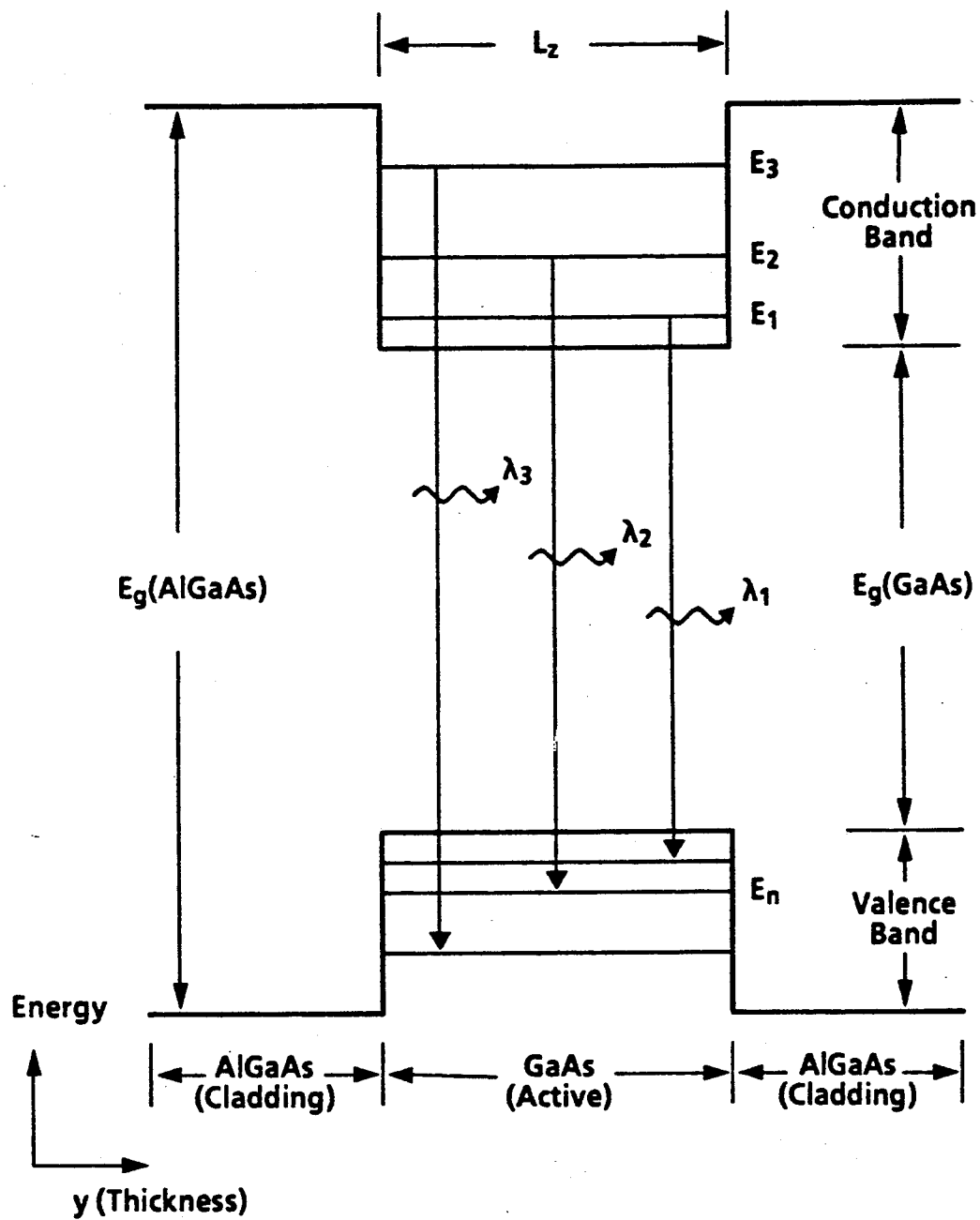
FIG. 1 shows a prior art typical bound-state diagram for a $GaAs/Al_xGa_{1-x}As$ quantum well structure illustrating one-dimensional quantization resulting in a series of discrete energy levels ("quantum levels")
Figure 2:
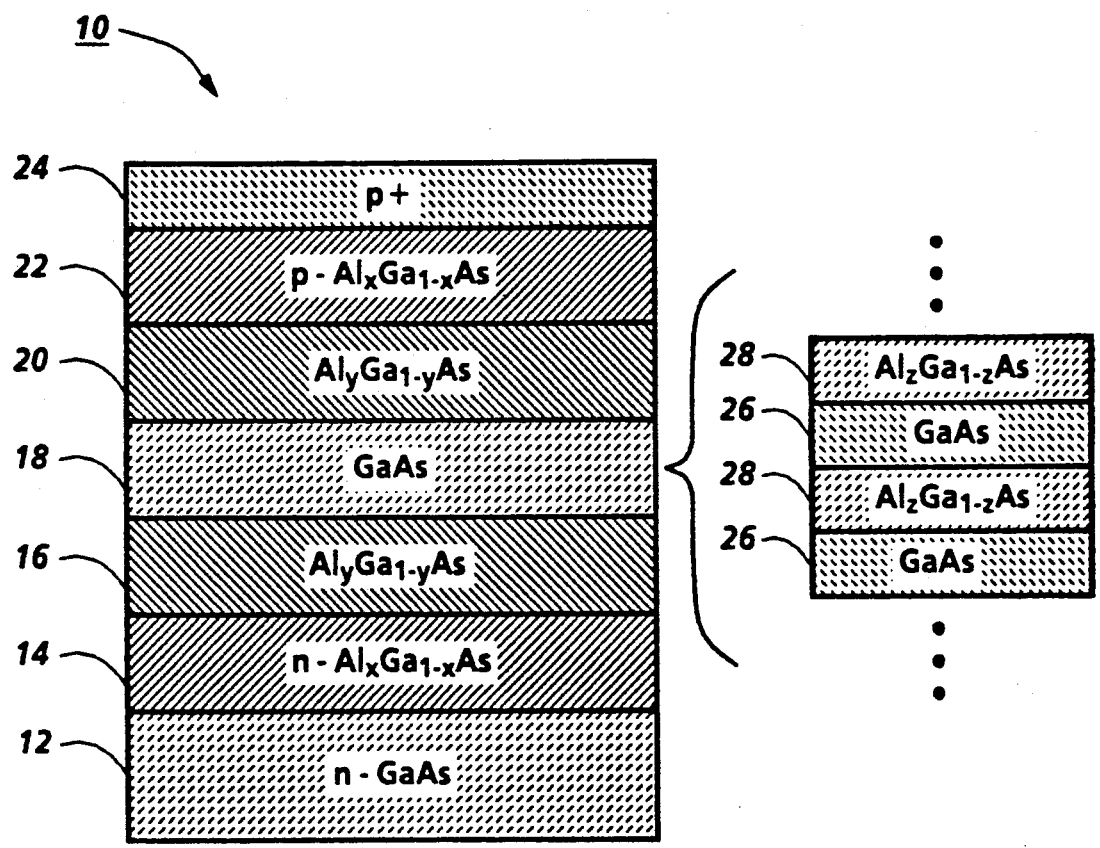
FIG. 2 shows the basic quantum well laser structure according to one embodiment of the present invention.

In order to provide a laser capable of stable operation at 2 or more wavelengths with reduced threshold current at one or more of these wavelengths and increased output intensity at shorter wavelengths, a basic quantum-well laser structure is fabricated, with certain modifications as detailed below. With reference to FIG. 2, a basic quantum-well laser structure 10 is shown which comprises an n-type GaAs substrate 12, upon which is epitaxially deposited an n-type $Al_xGa_{1-x}As$ cladding layer 14, an $Al_yGa_{1-y}As$ waveguide layer 16 where $x > y$, a GaAs quantum-well active layer 18 which is described in more detail below, an $Al_yGa_{1-y}As$ waveguide layer 20, a p-type $Al_xGa_{1-x}As$ cladding layer 22, and a p+-type cap layer 24. GaAs quantum-well active layer 18 is comprised of multiple alternating layers 26 and 28, respectively, of p, n, or undoped GaAs and $Al_zGa_{1-z}As$, with $z \geq y$. At the very least, there will be provided one layer each of layers 26 and 28, although as will be further discussed, the number, thickness and composition of each layer may be varied to achieve the ends of the present invention. The thickness of each of layers 26 and 28 will be on the order of the carrier de Broglie wavelength so that the layers exhibit the aforementioned quantum size effects (i.e., the carriers are quantized into different quantum levels) in one dimension.

It will be appreciated that this structure is just one exemplary embodiment of the present invention, and that others, such as an array (not shown) of structures 10, a structure with quantum levels in two dimensions, or a so-called "quantum wire" (see e.g., U.S. Pat. No. 5,138,625), a structure with quantum levels in three dimensions, or a so-called "quantum dot" or "quantum box" (see, e.g., Asada et al., *Gain and the Threshold of Three-Dimensional Quantum-Box Lasers*, IEEE J. Quant. Elec., vol. QE-22, no. 9, p. 1915 (1986)), etc., formed by a wide variety of processes, such as MOCVD, LPE, impurity induced layer disordering ("IILD"), etc., may equally embody the present invention. Thus, this description is not to be read as limiting the scope of the present invention, but rather as exemplary of the present invention claimed herein.

As described above, electrons and holes confined to a quantum well can reside only in states with discrete energies in the direction normal to the quantum well layer. These quantized states or energy levels are denoted by integer quantum numbers. Light is produced when an electron in the nth energy level of the conduction band recombines with a hole in the mth energy level of the valence band of the same quantum well. The energy $E_\lambda$ of the photon produced by this transition is given by $$E_\lambda = E_g + \Delta E_{cn} + \Delta E_{vm} \tag{6}$$

where $E_g$ is the intrinsic bandgap energy of the quantum well material, $\Delta E_{cn}$ is the energy of the confined electron in the nth energy level relative to the conduction bandedge and $\Delta E_{vm}$ is the energy of a confined hole in the mth energy level relative to the valence bandedge. $\Delta E_{cn}$ is determined by the thickness of the quantum well and the energy difference $V_{cb}$ between the conduction bandedge of the quantum well and the conduction bandedge of adjacent widegap confining layers, e.g., $Al_yGa_{1-y}As$ layers 16 and 20 (FIG. 2). The difference $V_{cb}$ is fixed by the relative compositons of the quantum well and its adjacent widegap material. Similarly, $\Delta E_{vm}$ is determined by the thickness of the quantum well and the energy difference $V_{vb}$ between the valence bandedge of the quantum well and the valence bandedge of adjacent widegap confining layers, e.g., $Al_yGa_{1-y}As$ layers 16 and 20 (FIG. 2). The difference $V_{vb}$ is fixed by the relative compositions of the quantum well and its adjacent widegap material. From R. M. Kolbas and N. Holonyak, Jr., *Man-made Quantum Wells: A New Perspective on the Finite Square-well Problem*, Am. J. Phys., vol. 52, no. 5, p. 431 (1984), $\Delta E_{cn}$ is given by the solutions of the following equations:

$$[2m_e\Delta E_{cn}/\hbar^2]^{\frac{1}{2}} \tan\{[2m_e\Delta E_{cn}/\hbar^2]^{\frac{1}{2}}L_z/2\} = [2m_e(V_{cb}-\Delta E_{cn})/\hbar^2]^{\frac{1}{2}} \tag{7a}$$

$$[2m_e\Delta E_{cn}/\hbar^2]^{\frac{1}{2}} \cot\{[2m_e\Delta E_{cn}/\hbar^2]^{\frac{1}{2}}L_z/2\} = -[2m_e(V_{cb}-\Delta E_{cn})/\hbar^2]^{\frac{1}{2}} \tag{7b}$$

where the effective mass of the electron $m_e = 0.067\ m_o$ ($m_o$ is the free electron mass), $L_z$ is the thickness of the quantum well, and h is Planck's constant divided by $2\pi$. The first equation determines the energy of the electronic state that is spatially symmetric in the quantum well, while the second equation determines the energy of the electronic state that is spatially antisymmetric in the quantum well. Similarly, the bound energy $\Delta E_{vm}$ of the hole in the quantum well is given by the solutions of the following equations:

$$[2m_h\Delta E_{vm}/\hbar^2]^{\frac{1}{2}} \tan\{[2m_h\Delta E_{vm}/\hbar^2]^{\frac{1}{2}}L_z/2\} = [2m_h(V_{vb}-\Delta E_{vm})/\hbar^2]^{\frac{1}{2}} \tag{8b}$$

$$[2m_h\Delta E_{vm}/\hbar^2]^{\frac{1}{2}} \cot\{[2m_h\Delta E_{vm}/\hbar^2]^{\frac{1}{2}}L_z/2\} = -[2m_h(V_{vb}-\Delta E_{vm})/\hbar^2]^{\frac{1}{2}} \tag{8b}$$

where $m_h$ is the mass of the hole. Since GaAs has two branches to its valence band, $m_h$ can have one of two values, 0.45 $m_o$ (donoted the "heavy hole") or 0.082 $m_o$ (denoted the "light hole"). Recombination of an electron with the heavy hole is normally the transition that gives rise to lasing in a GaAs quantum well. Therefore, for purposes of the present explanation, only recombinations with heavy holes will be considered herein. In addition due to the spatial distributions of wavefunctions for the electrons and holes, recombination of electrons with holes is nearly forbidden if $n \neq m$.

Figure 3A:
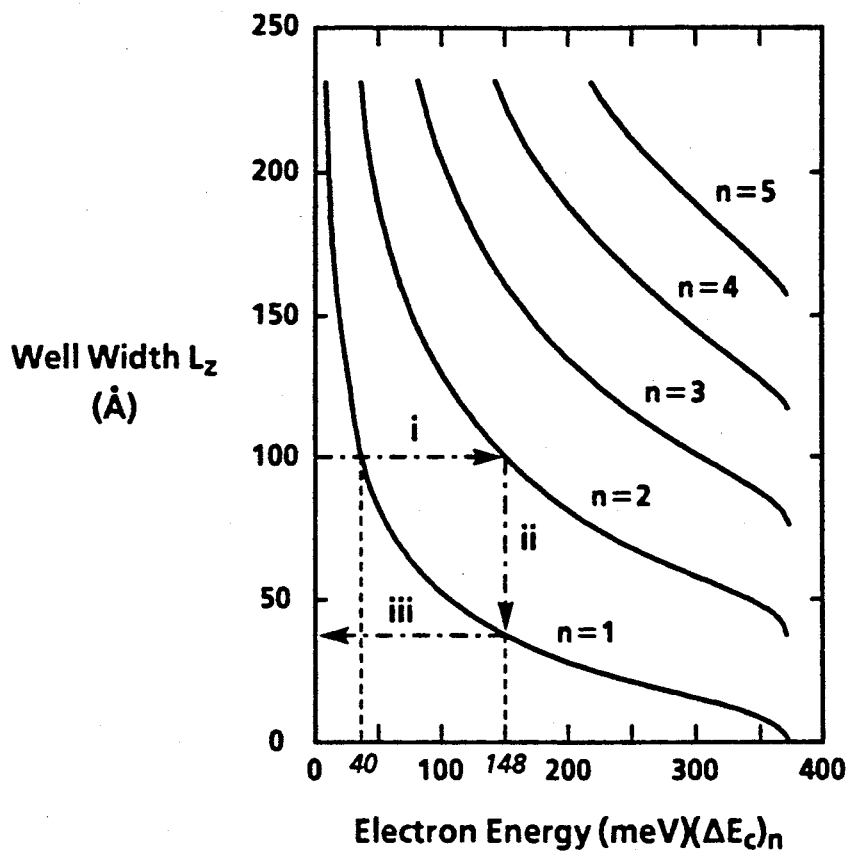
FIGS. 3a and 3b show the prior art calculated electron (FIG. 3a) and hole (FIG. 3b) energies for quantized levels in a GaAs quantum well of thickness $L_z$ sandwiched between layers of $Al_{0.35}Ga_{0.65}As$.
Figure 3B:
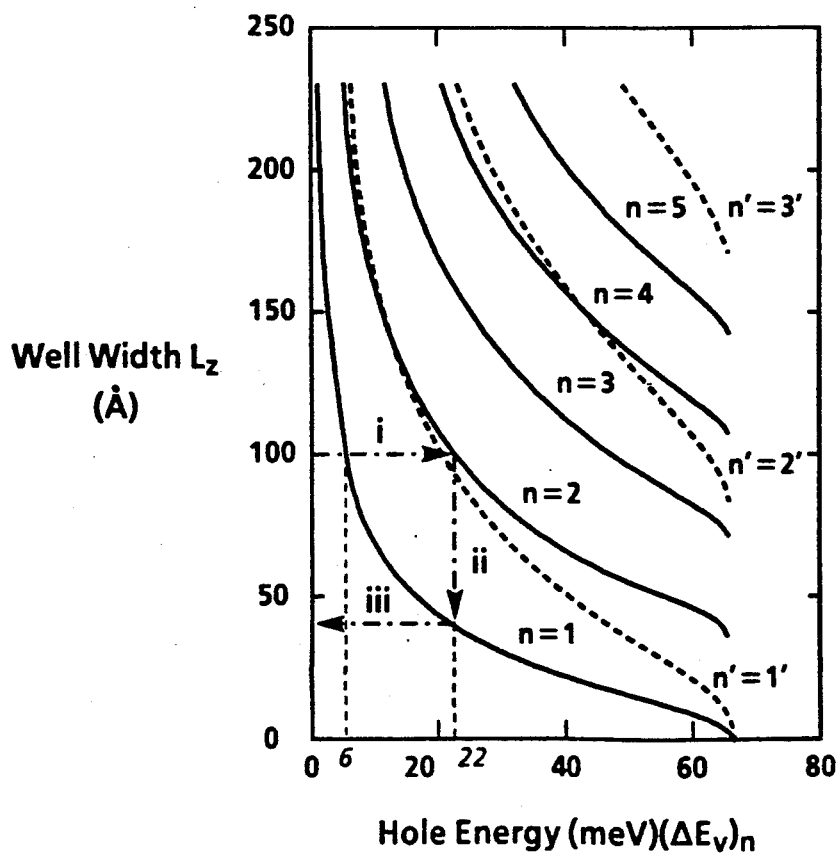

FIGS. 3a and 3b show the values of electron and hole energies for a GaAs layer sandwiched between two $Al_{0.35}Ga_{0.65}As$ confining layers. Considering a well with thickness 100 Å as an example, we obtain $\Delta E_{c1} = 40$ meV, $\Delta E_{c2} = 148$ meV, and $\Delta E_{v1} = 6$ meV, and $\Delta E_{v2}=22$ meV. Since $E_g=1.424$ eV for GaAs, recombination in the lowest energy level, $n=m=1$, occurs at $E_\lambda=1.424+0.040+0.006=1.470$ eV. From equation (5) we get $\lambda=(12398/1.47)\approx843$ nm. Recombination in the next highest energy level, $n=m=2$, occurs at $E_\lambda=1.424+0.148+0.022=1.594$ eV, from which we get $\lambda=(12398/1.594)\approx778$ nm.

The present invention requires that the nth level in the conduction band of one quantum well be aligned with the n'th ($n>n'$) level in the conduction band of one or more other quantum wells in a MQW active layer. Preferably, these two quantum wells are adjacent one another in the band diagram (i.e., are disposed directly above or below one another in the quantum well active layer), although they need not necessarily be so placed. Energy levels with different quantum numbers are aligned by properly choosing the thickness and/or composition of the quantum well layers.

Figure 4A:
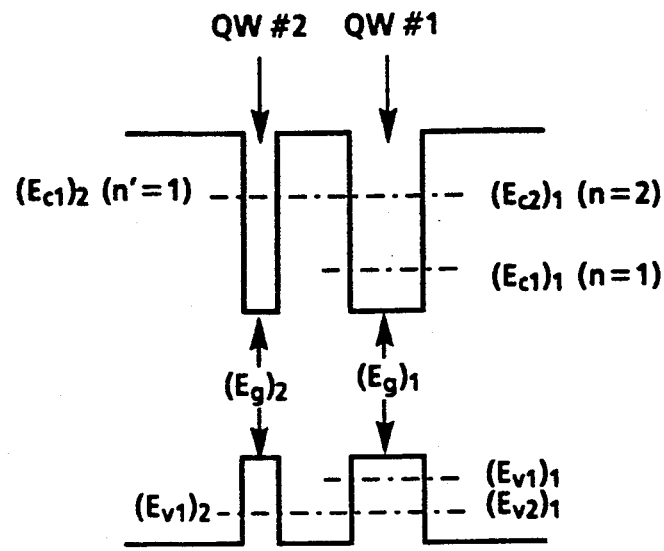
FIGS. 4a and 4b are schematic illustrations of two different configurations of an active layer containing two quantum wells formed according to this invention.

To illustrate the procedure by which such a multiple wavelength active layer is designed, we consider a two well system composed of GaAs wells and $Al_{0.35}Ga_{0.65}As$ confinement layers, as shown in FIG. 4a. To determine suitable thickness for the quantum wells, we select the thickness of well 1 to be a convenient value, e.g., $L_z=100$ Å, and utilize FIGS. 3a and 3b to determine the width of well 2 required to align the $n=2$ level in well 1 with the $n'=1$ level in well 2. The selection is performed following the diagrammatic arrows in FIGS. 3a and 3b, in the sequence i-ii-iii. Thus, from equation (6) recombination in quantum well 1 occurs from $(E_{c1})_1$ to $(E_{v1})_1$ at photon energy equal to $E_\lambda=1.424$ eV$+0.04$ eV$+0.006$ eV$=1.470$ eV, corresponding to $\lambda=843$ nm, and from $(E_{c2})_1$ to $(E_{v2})_1$ at photon energy equal to $E_\lambda=1.424$ eV$+0.148$ eV$+0.022$ eV$=1.594$ eV, corresponding to $\lambda=778$ nm. Recombination in quantum well 2 occurs only from $(E_{c1})_2$ to $(E_{v1})_2$ at photon energy equal to $E_\lambda=1.424$ eV$+0.148$ eV$+0.022$ eV$=1.594$ eV, corresponding to $\lambda=778$ nm, since this is the lowest quantized energy level in well 2. The thickness of the second quantum well is determined by step iii to be ~40 Å.

Figure 4B:
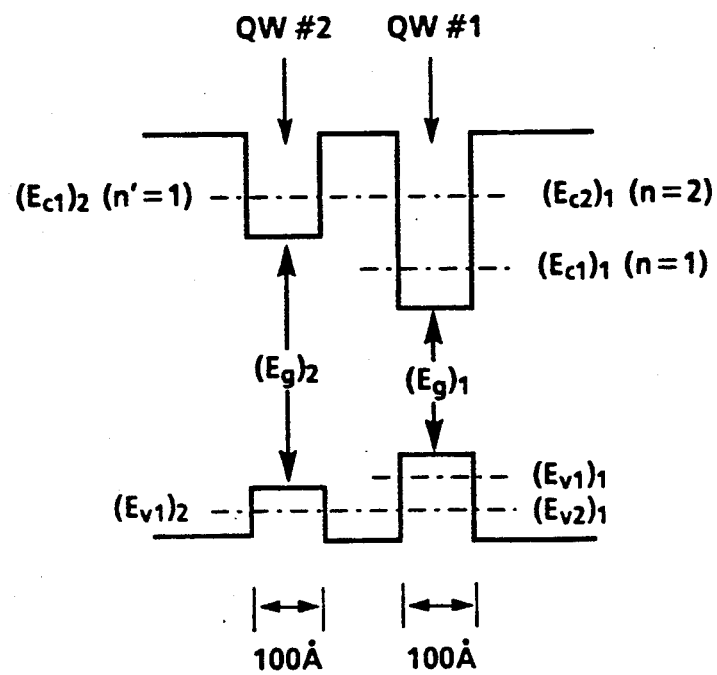

Alignment of the nth and n'th levels of two quantum wells in the conduction band such that each well has the same thickness is achieved by adjusting the composition of one well in order to increase its bandgap. To illustrate this procedure, we consider a two well system composed of on GaAs well and one $Al_xGa_{1-x}As$ well separated by a $Al_{0.35}Ga_{0.65}As$ confinement layer, as shown in FIG. 4b. Both quantum wells have the same thickness, taken to be 100 Å for illustration. To determine the appropriate composition x for the $Al_xGa_{1-x}As$ well, we set the energy for the $n'=1$ transition in quantum well 2 equal to the energy for the $n=2$ transition in quantum well 1, i.e., $$(E_g)_2+(\Delta E_{c1})_2+(\Delta E_{v1})_2=(E_g)_1+(\Delta E_{c2})_1+(\Delta E_{v2})_1 \qquad (9)$$

Solving for $(E_g)_2$ and substituting for the known values, we obtain $(E_g)_2=1.594-0.040-0.006=1.548$ eV, where 1.594 eV is the transition energy previously calculated for the $n=2$ transition in quantum well 1. From the well-known relation between the bandgap energy and alloy composition in AlGaAs, as described by in H. C. Casey and M. B. Panish in "Heterostructure Lasers: Part A", p. 193 (Academic Press, 1978), the bandgap energy of 1.548 eV corresponds to $Al_{0.1}Ga_{0.9}As$.

Alignment of the nth level in one quantum well with the n'th level in another quantum well can also be achieved by simultaneously adjusting the thickness and composition of one well.

For illustrative purposes we have described the alignment of the $n=2$ level in one well with the $n'=1$ level in a second well. It is also part of this invention to include other values of n and n' for which $n>n'$. Therefore, alignment of the $n=3$ level in one well with the $n'=2$ level in a second well or alignment of the $n=3$ level in one well with the $n'=1$ level in a second well are achieved in the same way by adjusting the thickness, composition, or thickness and composition of one well.

The present invention utilizes the alignment of energy bands in two quantum wells within the same active layer to increase the gain at the output wavelength corresponding to the aligned energy bands and thereby decrease the threshold current required for lasing at that wavelength. Increased gain is achieved and controlled by proper positioning of the quantum wells relative to the intensity profile of the optical mode within the laser waveguide. The way in which this increased gain is achieved can be understood by referring to FIGS. 5a through 5d. The gain of the mode, $G(\lambda_1)$, emitted at $\lambda_1$, is proportional to $A(x_1)g_1(\lambda_1)$, where $A(x_1)$ is the relative intensity of the mode at $x_1$ and $g_1(\lambda_1)$ is the optical gain of the medium in quantum well 1 at $\lambda_1$. Similarly the gain of the mode, $G(\lambda_2)$, emitted at $\lambda_2$, is proportional to $A(x_1)g_1(\lambda_2)+A(x_2)g_2(\lambda_2)$, where $g_1(\lambda_2)$ is the optical gain in quantum well 1 at $\lambda_2$, $A(x_2)$ is the relative intensity of the mode at $x_2$, and $g_2(\lambda_2)$ is the optical gain in quantum well 2 at $\lambda_2$. Taking the ratio of the gain at $\lambda_2$ to the gain at $\lambda_1$, we obtain $$G(\lambda_2)/G(\lambda_1)=[g_1(\lambda_2)/g_1(\lambda_1)]+[A(x_2)/A(x_1)][g_2(\lambda_2)/g_1(\lambda_1)] \qquad (10)$$

Figures 5A, 5B:
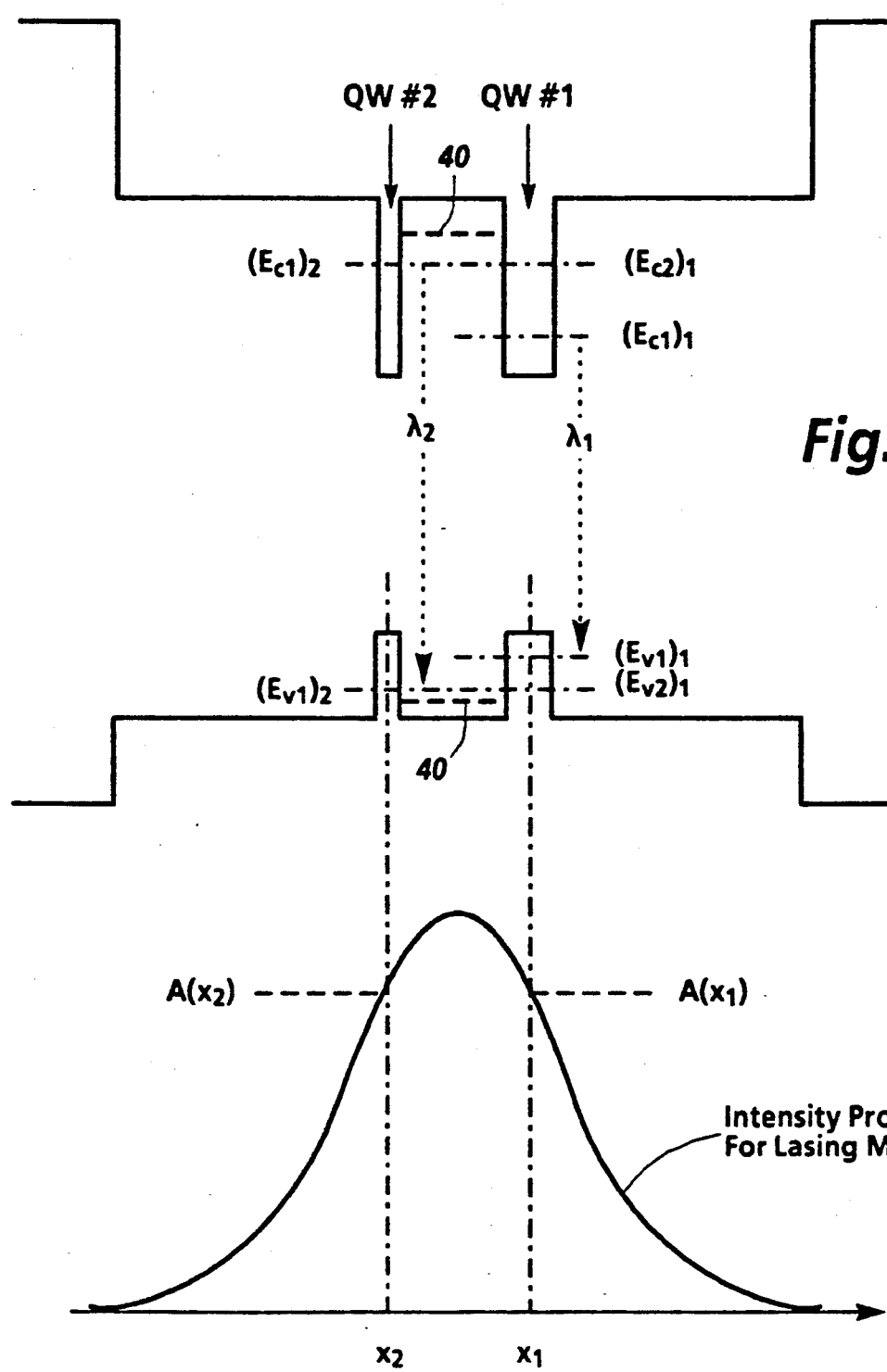
FIGS. 5a, 5c and 5b, 5d are, respectively, a schematic illustration of the locations of two quantum wells relative to the intensity profile, and a sketch of that intensity profile, for the lasing mode within the laser waveguide according to two different embodiments of this invention.

The first term on the right is the ratio of the material gain at $\lambda_2$ to the material gain at $\lambda_1$ for quantum well 1 and therefore gives the relative amount of gain for the two transitions without a second quantum well in the laser waveguide. The presence of the second well increases the gain at $\lambda_2$ by $[A(x_2)/A(x_1)][g_2(\lambda_2)/g_1(\lambda_1)]$. Since $g_2(\lambda_2)$ arises from the lowest energy level in quantum well 2, it will increase faster with increasing carrier density than $g_1(\lambda_2)$. Thus, by placing the quantum wells near to and symmetrically on either side of the peak optical intensity in the laser waveguide, so that $A(x_2)=A(x_1)$, as shown in FIGS. 5a and 5b, the threshold for the mode at $\lambda_2$ will be less than its threshold with gain derived from only one quantum well. The wells can be spaced close enough to allow effective tunneling between $(E_{c1})_2$ and $(E_{c2})_1$.

Figures 5C, 5D:
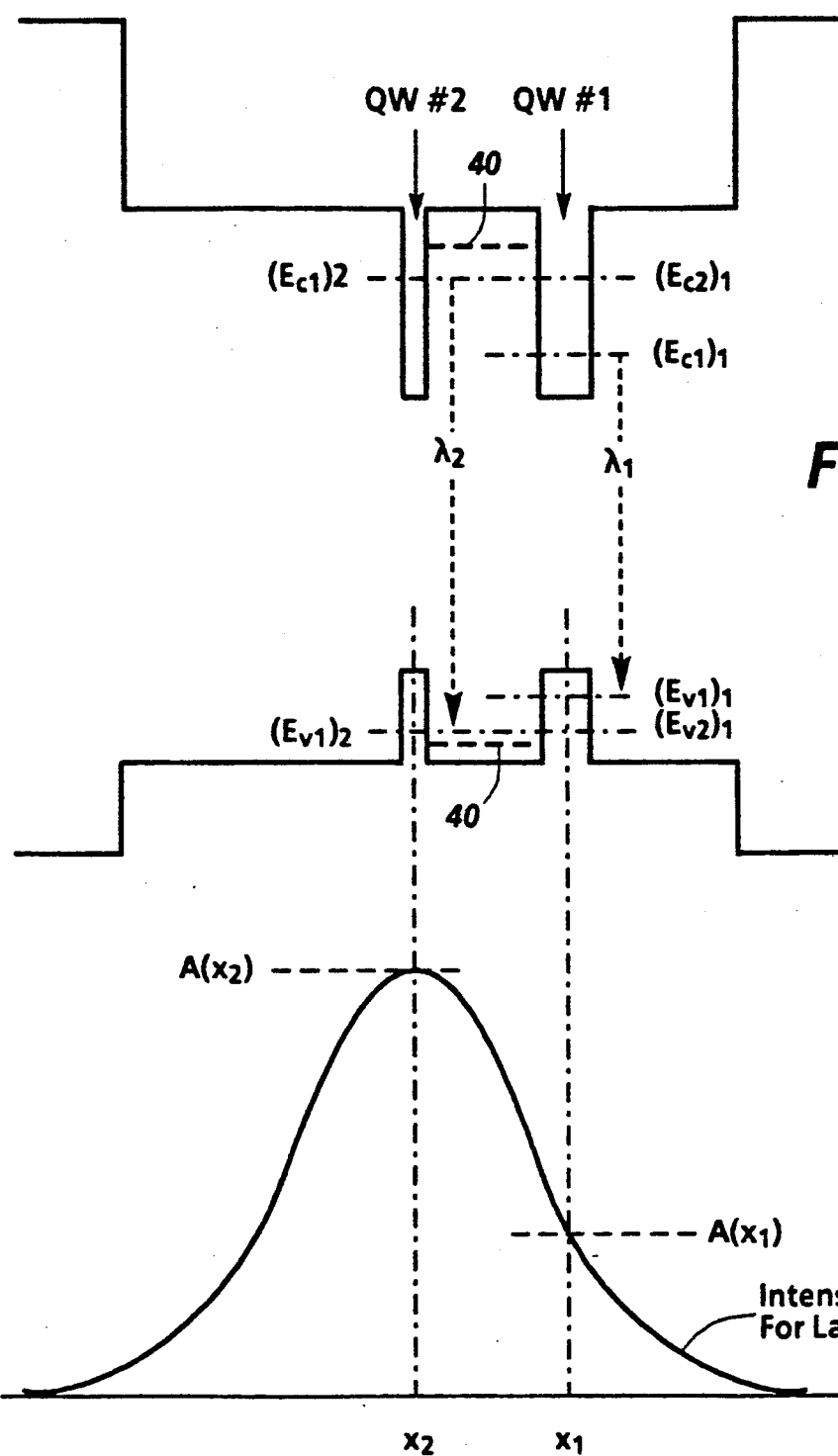

It is another aim of this invention to provide a structure for which the difference between thresholds at $\lambda_2$ and $\lambda_1$ is minimized. This aim is achieved by placing quantum well 2 at the maximum of the intensity profile and choosing $x_1-x_2$ to be greater than half the full width at half maximum for the lasing mode so that the ratio $[A(x_2)/A(x_1)]$ is greater than 2. This is shown in FIGS. 5c and 5d. Consequently, the gain of the mode at $\lambda_2$ is enhanced relative to the gain obtained at $\lambda_1$ for the same carrier density and the difference between their thresholds can be adjusted as desired by appropriately selecting $x_1$. In this way the difference between the thresholds for lasing at $\lambda_2$ and $\lambda_1$ can be decreased to zero, thereby allowing the laser waveguide to lase simultaneously at two widely separated wavelengths if so desired.

Figure 6:
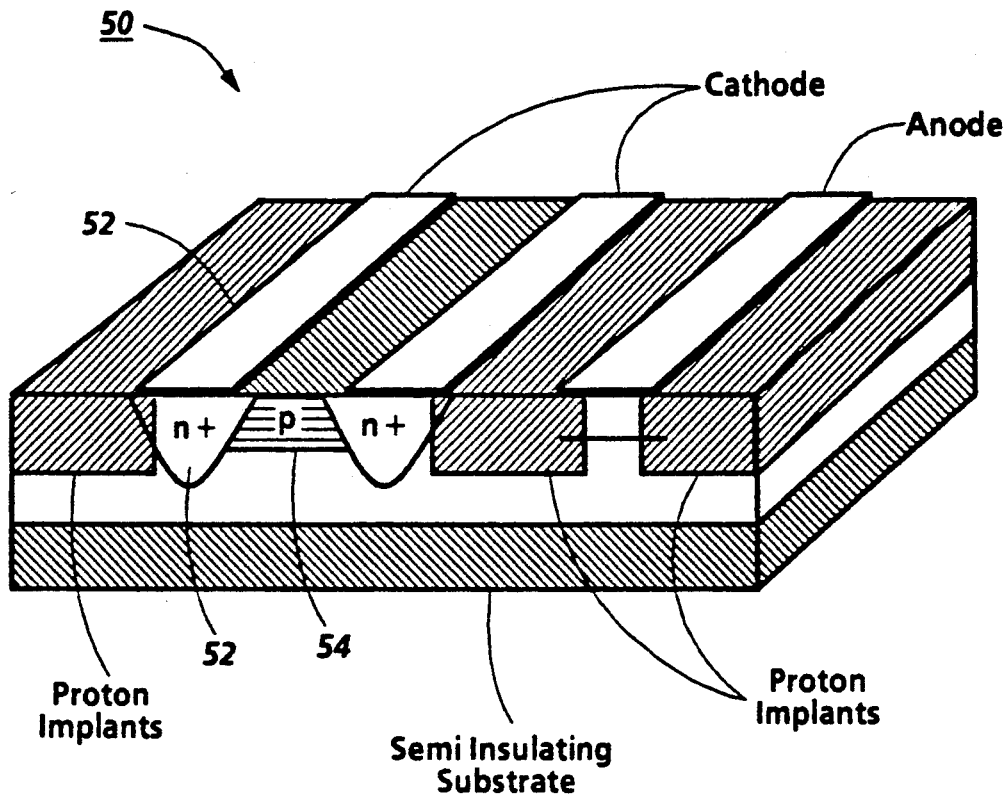
FIG. 6 is a schematic illustration of diode laser structure used to inject current into multiple wavelength coaxially emitting diode lasers with quantum well active layers formed according to one embodiment of this invention.

Since the full width at half maximum for the optical mode in the laser waveguide is typically about 1 μm, the quantum wells should be spaced by 0.5 μm or more. This distance is rather large for effectively injecting carriers into both wells from the cladding layers 14 and 22 shown in FIG. 2. However, carriers can be effectively coupled between wells with this separation by lowering the bandgap of the confining layer between them as shown by the dotted line 40 in FIGS. 5a and 5c. For these structures, electrons injected from the n-side (right side of FIGS. 5a and 5c) which fall into quantum well 1 will readily be thermalized into quantum well 2. A preferred embodiment for injecting an adequate number of carriers into both wells is a laterally injected laser waveguide such as that described by Thornton in U.S. Pat. No. 4,987,468, dated Jan. 22, 1991. An example of such a structure 50 is shown in FIG. 6. For this structure 50, electrons are injected by n-type disordered regions 52 used to form the lateral extent of the waveguide while holes are supplied by the p-type quantum wells of region 54. Lasers defined in this way with uniform multiple quantum well active layers exhibit very low threshold as discussed in detail in the aforementioned patent.

Figure 7A:
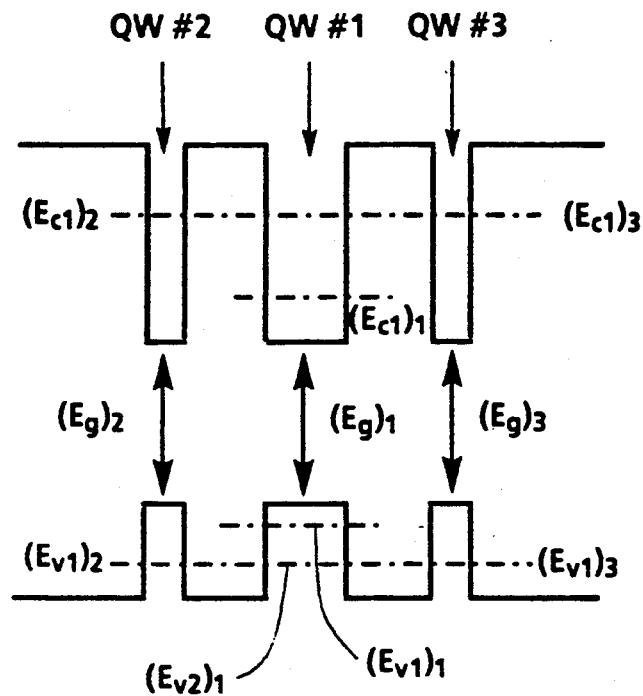
FIGS. 7a and 7b are schematic illustrations of two different configurations of an active layer containing three quantum wells formed according to this invention.
Figure 7B:
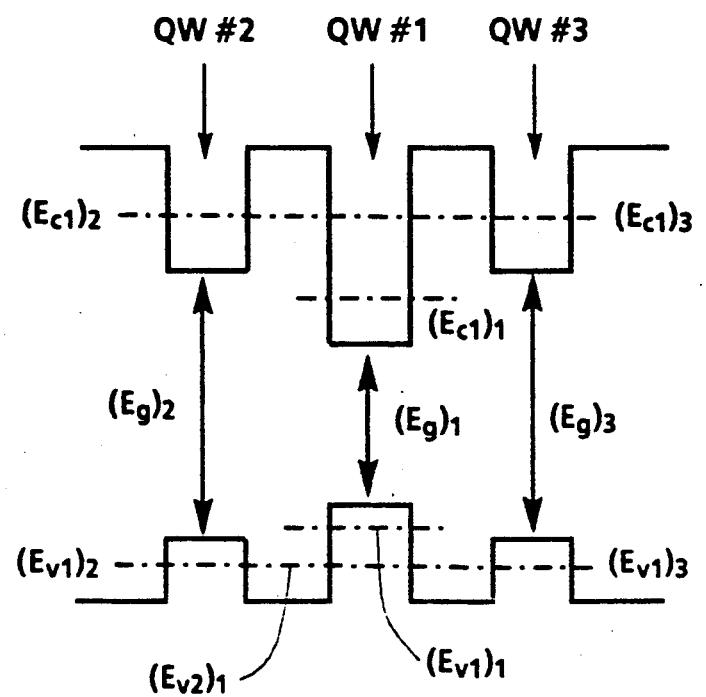

FIGS. 7a and 7b shown another embodiment of the present invention using three quantum wells to reduce the threshold current for lasing at the shortest wavelength. Alignment of energy bands in three quantum wells within the same active layer provides an even greater increase in the gain at the output wavelength corresponding to the aligned energy bands than the embodiment comprising two quantum wells previously discussed. Alignment of the nth level in the conduction band of one quantum well with the n'th level in two adjacent wells, for example on either side of the first well (although they need not be so disposed), can be achieved by decreasing the thickness of the two adjacent wells as illustrated in FIG. 7a or by using three wells with the same thickness while adjusting the composition of the two adjacent wells to increase their bandgap as illustrated in FIG. 7b. The procedure for accomplishing these alignments is similar to that discussed previously and illustrated in FIGS. 3a and 3b.

Figure 8A:
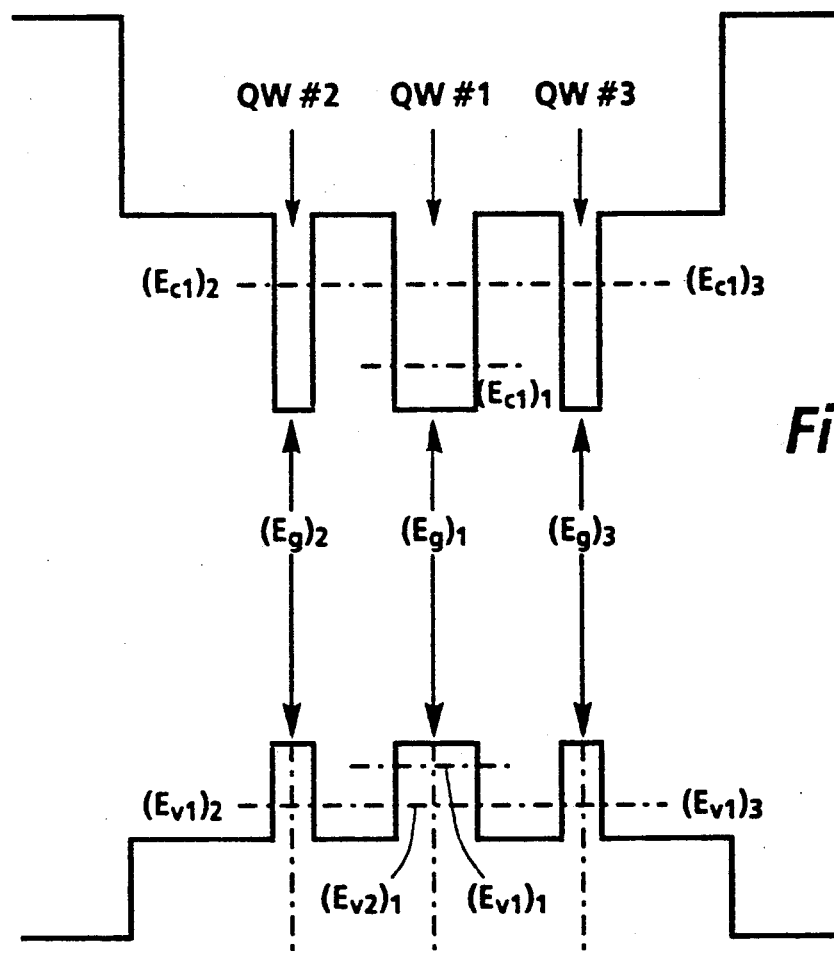
FIGS. 8a and 8b are, respectively, a schematic illustration of the locations of three quantum wells relative to the intensity profile, and a sketch of that intensity profile, for the lasing mode within the laser waveguide according to a particular embodiment of the present invention.
Figure 8B:
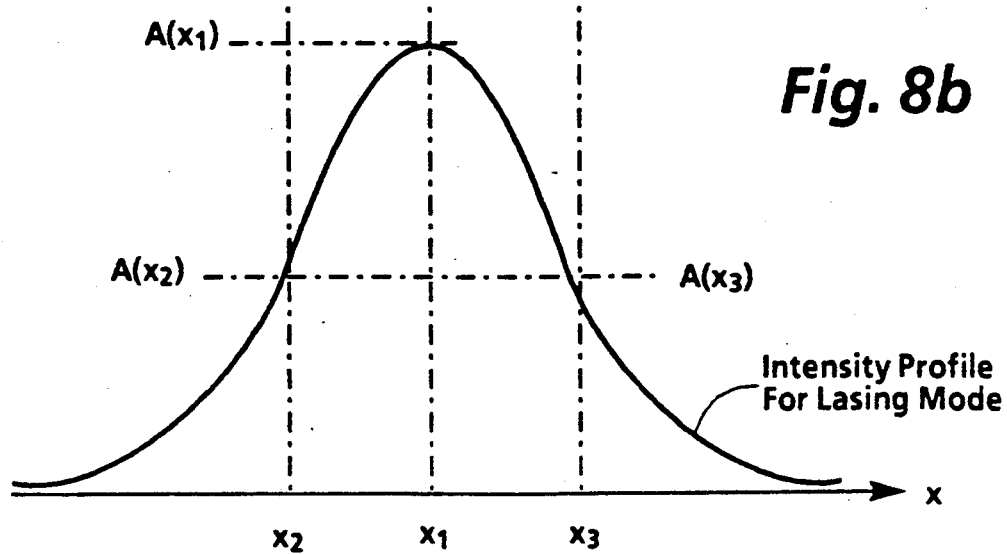

Energy band alignment is used to decrease the threshold for the lasing mode at the shortest wavelength by proper positioning of the quantum wells relative to the intensity profile of the lasing mode within the laser waveguide. The advantage of the 3 well structure is readily seen by considering the relative gains of the modes emitted at $\lambda_1$ and $\lambda_2$. The thickest (or deepest) well, quantum well 1 in FIG. 8a, is located at the position of maximum intensity of the lasing mode, as illustrated in FIGS. 8a and 8b. The gain of the mode emitted at $\lambda_1$, $G(\lambda_1)$, is proportional to $A(x_1)g_1(\lambda_1)$ and the gain of the mode emitted at $\lambda_2$, $G(\lambda_2)$, is proportional to $A(x_1)g_1(\lambda_2)+A(x_2)g_2(\lambda_2)+A(x_3)g_3(\lambda_2)$, where $A(x_3)$ is the relative intensity of the mode at $x_3$ and $g_3(\lambda_2)$ is the optical gain of quantum well 3 at $\lambda_2$. Taking the ratio of the gain at $\lambda_2$ to the gain at $\lambda_1$, we obtain $$G(\lambda_2)/G(\lambda_1)=[g_1(\lambda_2)/g_1(\lambda_1)]+[A(x_2)/A(x_1)][g_2(\lambda_2)/g_1(\lambda_1)]+[A(x_3)/A(x_1)][g_3(\lambda_2)/g_1(\lambda_1)] \quad (11)$$

The first term on the right is the ratio of the gain at $\lambda_2$ to the gain at $\lambda_1$ for a single quantum well and therefore gives the relative amounts of gain for the two transitions without other quantum wells in the laser waveguide. The presence of the second and third wells increases the gain at $\lambda_2$ by $[A(x_2)/A(x_1)][g_2(\lambda_2)/g_1(\lambda_1)]+[A(x_3)/A(x_1)][g_3(\lambda_2)/g_1(\lambda_1)]$. This contribution to $G(\lambda_2)$ is most important because the gain from the n=1 energy level in quantum well 2 or quantum well 3, i.e., $(E_{c1})_2$ or $(E_{c1})_3$, increases faster with current than the gain from the n=2 energy level in quantum well 1, i.e., $(E_{c2})_1$. In other words, as the current to the three-well structure is increased, $g_2(\lambda_2)$ and $g_3(\lambda_2)$ will approach $g_1(\lambda_1)$ at a current much lower than $g_1(\lambda_2)$ will reach the level of $g_1(\lambda_1)$. Hence the threshold for the mode at $\lambda_2$ will be lower than it would be in a single well structure.

It is evident that $G(\lambda_2)$ is maximized relative to $G(\lambda_1)$ by maximizing $[A(x_2)/A(x_1)]$ and $[A(x_3)/A(x_1)]$. This is achieved by locating all the quantum wells near the position of maximum intensity of the lasing mode. Thus, a typical three well structure would include a central well of GaAs with thickness equal to 100 Å spaced apart from two GaAs wells with thickness equal to 45 Å by confinement layers of $Al_{0.35}Ga_{0.65}As$ with thickness equal to 30 Å confinement layers, tunneling will readily occur between $(E_{c1})_2$, $(E_{c2})_1$, and $(E_{c1})_3$ and help maintain a uniform distribution of carriers in all wells.

Alignment of the nth level in one quantum well with the n'th level in two adjacent wells can also be achieved by simultaneously adjusting the thickness and composition of the two adjacent wells.

It is another aim of this invention to provide a structure for which the difference between thresholds at $\lambda_2$ and $\lambda_1$ is minimized. This aim is achieved for this embodiment by placing quantum wells 2 and 3 near the maximum of the intensity profile and choosing $x_1-x_2$ and $x_1-x_3$ greater than half the full width at half maximum for the lasing mode so that the ratios $[A(x_2)/A(x_1)]$ and $[A(x_3)/A(x_1)]$ are greater than 2. Consequently, the gain of the mode at $\lambda_2$ is enhanced relative to the gain obtained at $\lambda_1$ for the same carrier density and the difference between their thresholds can be adjusted as desired. Since the full width at half maximum for the optical mode in the laser waveguide is typically about 1 μm, quantum wells 2 and 3 should be spaced by 0.5 μm or more from quantum well 1. This distance is rather large for effectively injecting carriers into both wells from the cladding layers 14 and 22 of structure 10 shown in FIG. 2. However, carriers can be effectively coupled between wells with this separation by lowering the bandgap of the confining layer between them as discussed previously with regard to FIGS. 5a and 5c. For such a structure, electrons injected from the n-side which fall into quantum wells 2 and 3 will readily be thermalized into quantum well 1. A preferred embodiment for injecting an adequate number of carriers into both wells is the laterally injected laser waveguide described in the aforementioned U.S. Pat. No. 4,987,468 of Thornton, an example of which shown at 50 in FIG. 6.

Figure 9A:
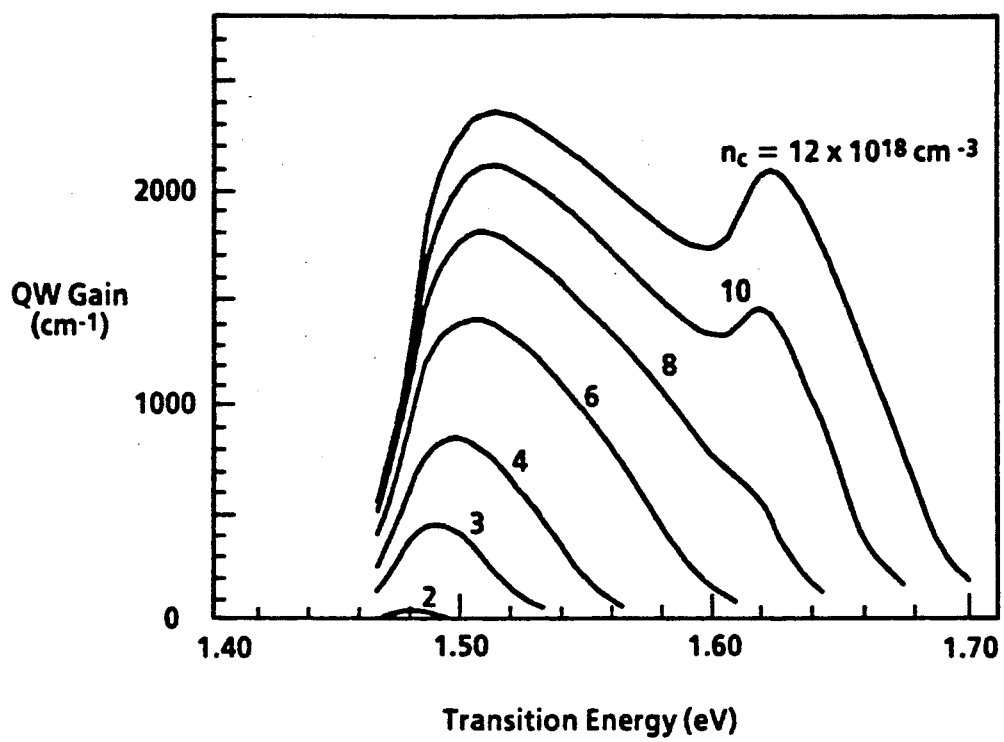
FIG. 9a is a prior art calculation of the modal gain for a single quantum well active layer at various levels of carrier density, or equivalently current, supplied to the quantum well.
Figure 9A:
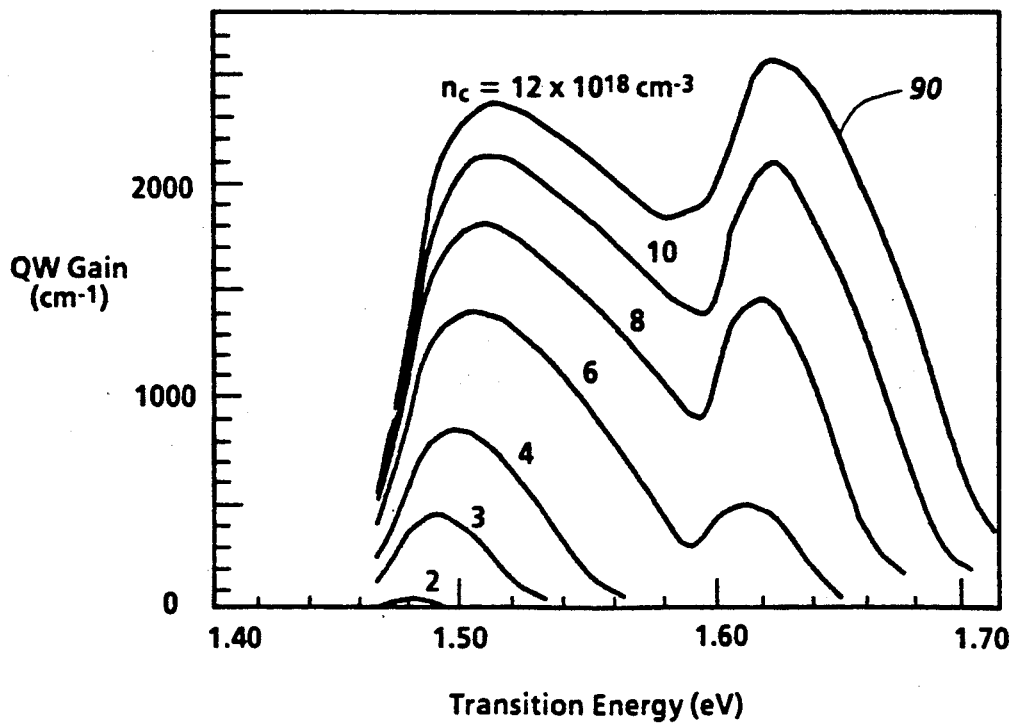

As an example of the gain enhancement enabled by multiple quantum active layers formed according to this invention, we refer to FIG. 9a which illustrates the modal gain $G(\lambda)$ obtained at various levels of carrier density in a single quantum well. See for example, J. Z. Wilcox et al., *Dependence of Emission Wavelength on Cavity Length and Facet Reflectivities in Multiple Quantum Well Semiconductor Lasers*, Appl. Phys. Lett., vol. 54, no. 22, p. 2174, (1989). At low carrier density, the gain spectrum is a single peaked function arising from recombination in quantum well 1 with emission at $\lambda_1$. As the carrier density is increased, bandfilling takes place, the gain from recombination in the n=1 level begins to saturate, and carriers begin to occupy the second quantum level. Consequently a second peak in the gain occurs at the wavelength $\lambda_2$ corresponding to the n=2 transition. The enhanced gain enabled by the MQW structures formed according to this invention is illustrated by curve 90 in FIG. 9b where the modal gain at $\lambda_2$ is significantly increased relative to the gain at $\lambda_1$ as carriers occupy the n=2 level of quantum well 1 and the n'=1 level of the other quantum wells. Thus, the threshold for the mode at $\lambda_2$ is lower than obtained with SQW or MQW active layers not formed according to this invention.

Figure 10:
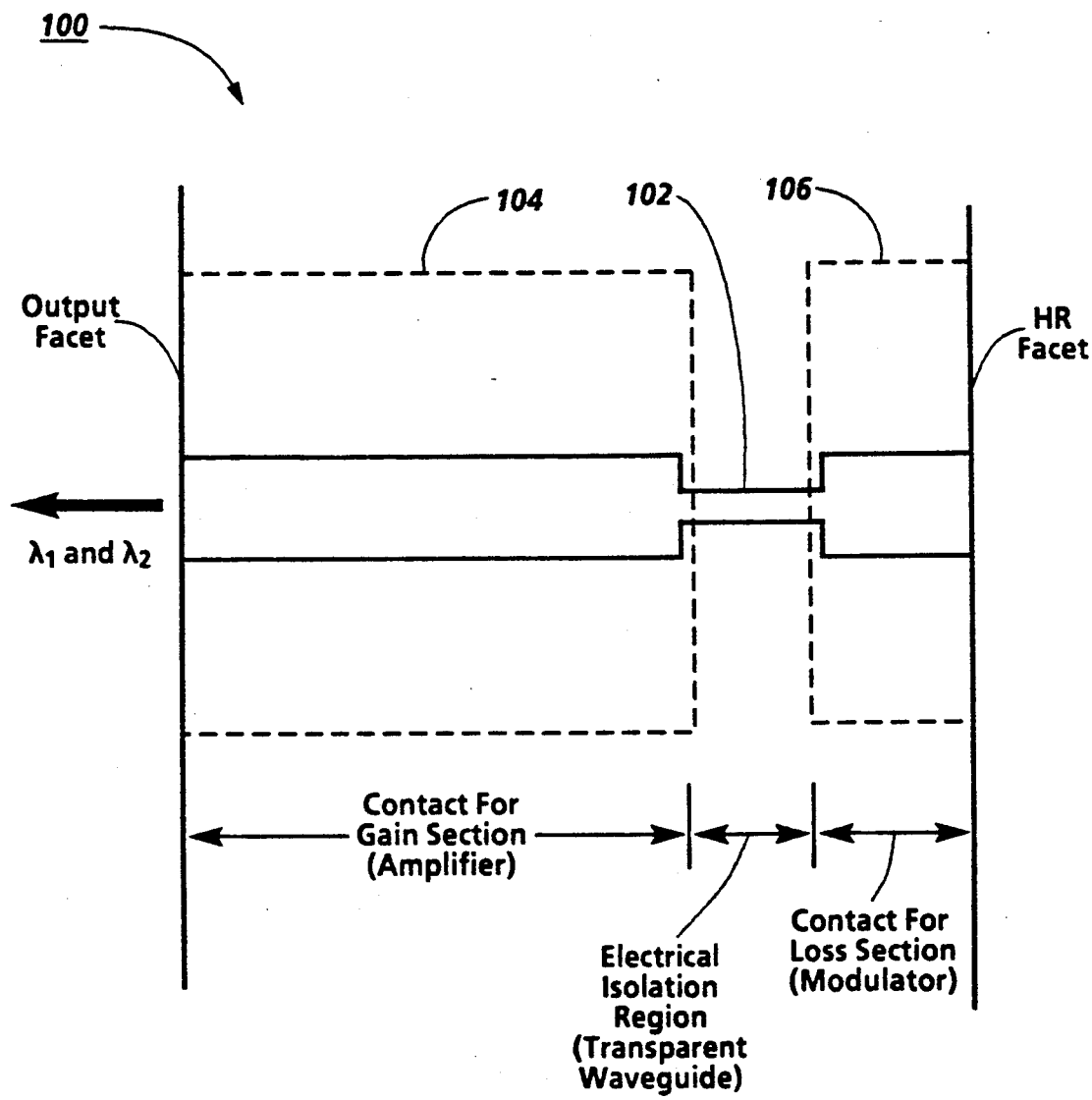
FIG. 10 is a schematic illustration of a laser structure used to select the operating wavelength of a multiple wavelength coaxially emitting diode laser with quantum well active layers formed according to this invention.

According to the present invention, one method of selecting the wavelength of lasing emission is by controlling the loss in the laser cavity. One method of achieving this loss control is to introduce a small but separately contacted modulator region along the axis of the laser as well known in the art. See for example, Thornton et al., U.S. Pat. No. 4,802,182. An example of such a structure 100 is shown in FIG. 10, where a narrow optical waveguide 102 is used to optically couple and simultaneously electrically isolate an amplifier region 104 and a modulator region 106 of the laser cavity. See also copending U.S. patent application Ser. No. 07/779,207 commonly assigned. Structure 100 can be fabricated, for example, by IILD as described by Thornton et al. in U.S. Pat. No. 4,802,182, or by other techniques known to those skilled in the art.

Figure 11:
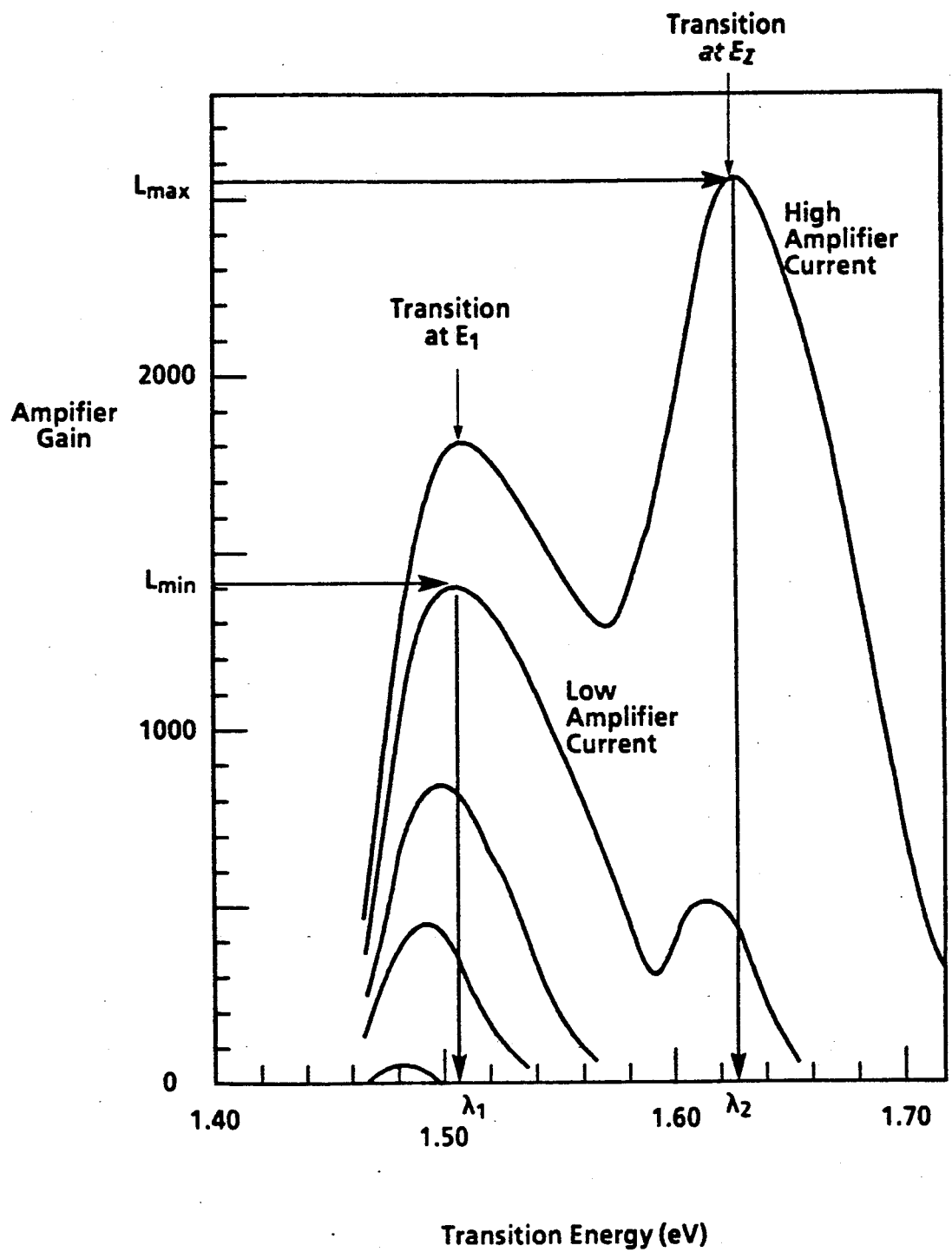
FIG. 11 illustrates how variation of the optical loss within the laser cavity enables wavelength switching of multiple quantum well active layers formed according to this invention.

Wavelength switching within the laser waveguide of laser 100 is achieved by controlling the optical loss introduced by modulator region 106. The lasing photon wavelength is established where the gain of amplifier region 104 equals the loss of the laser cavity, including absorption in modulator region 106, as illustrated in FIG. 11. The total loss present in the laser cavity is varied by changing the bias level on modulator region 106 from a maximum value $L_{max}$ obtained when modulator region 106 is reverse biased or unbiased to a minimum value $L_{min}$ obtained with an appropriate level of current applied to modulator region 106. The amount of loss is chosen such that $L_{max}$ prevents lasing until the current to amplifier region 104 is increased sufficiently to populate the n'=1 transition in the narrow (or shallow) wells and lasing occurs at $\lambda_2$. The precise shift in the lasing wavelength is determined by the level of the loss introduced by modulator region 106, $L_{mod}$, as $$L_{mod} = L_{max} - L_{min} \tag{12}$$

Note that the gain at $\lambda_2$ must become greater than the maximum gain at $\lambda_1$ in order for lasing to occur at $\lambda_2$. The enhanced gain introduced by this invention enables this condition to be achieved at a current lower than that obtained with SQW or MQW active layers not formed according to this invention.

Figure 12A:
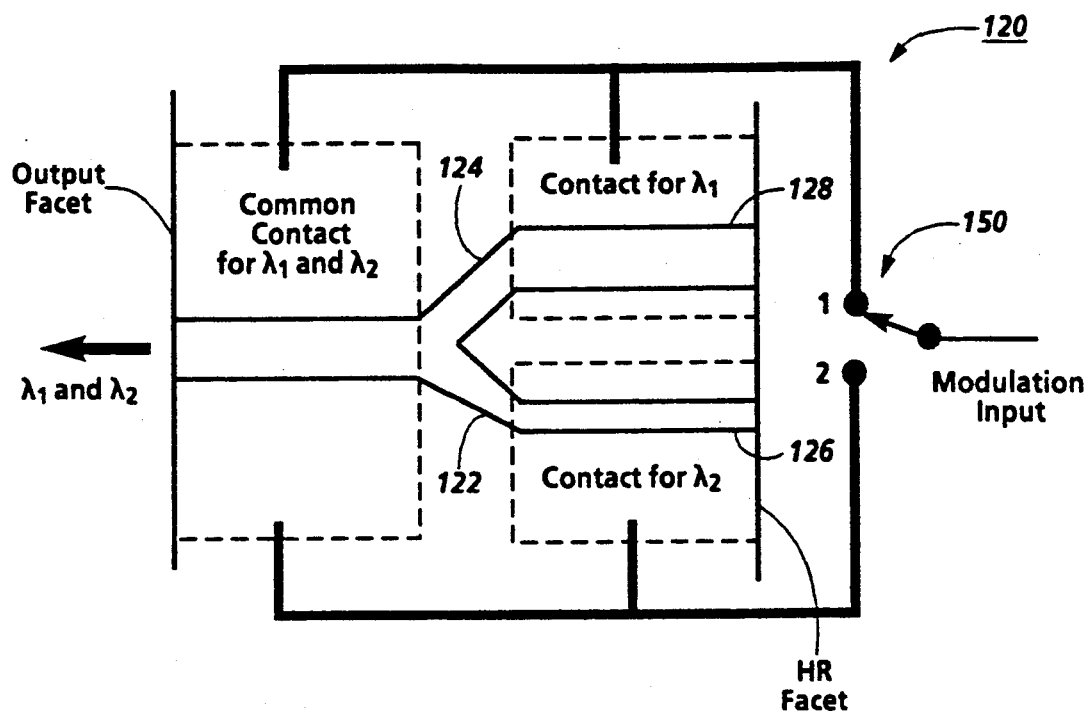
FIGS. 12a, 12b, and 12c are schematic illustrations of alternative embodiments of a laser structure employing the multiple quantum well active layers formed according this invention.
Figure 12B:
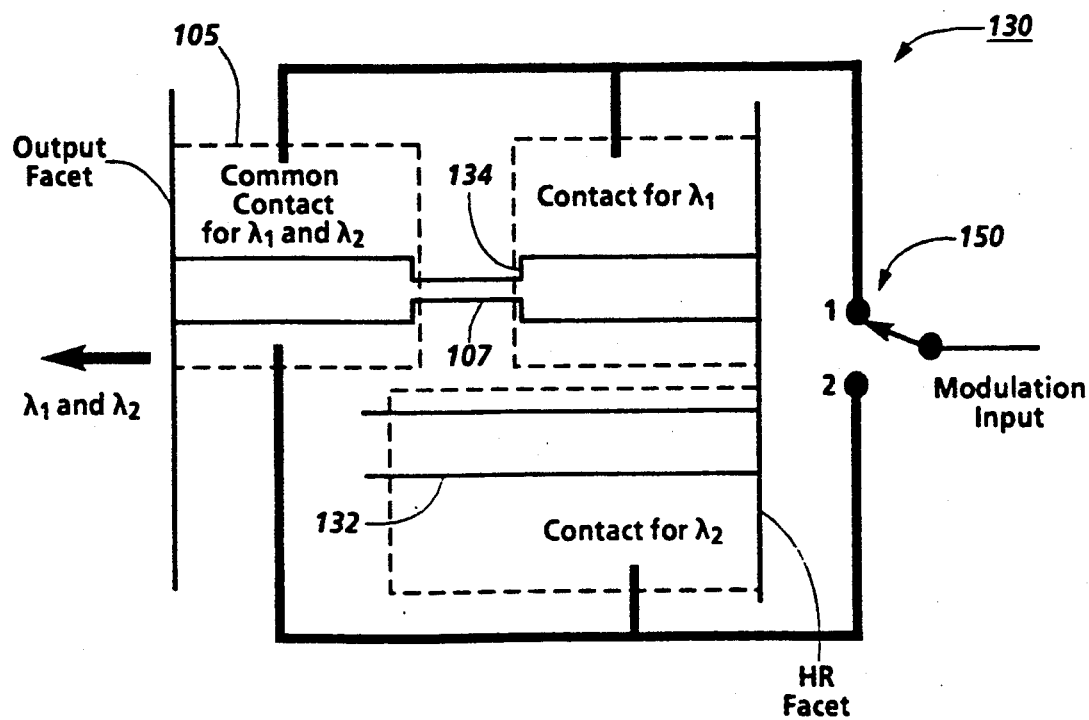
Figure 12C:
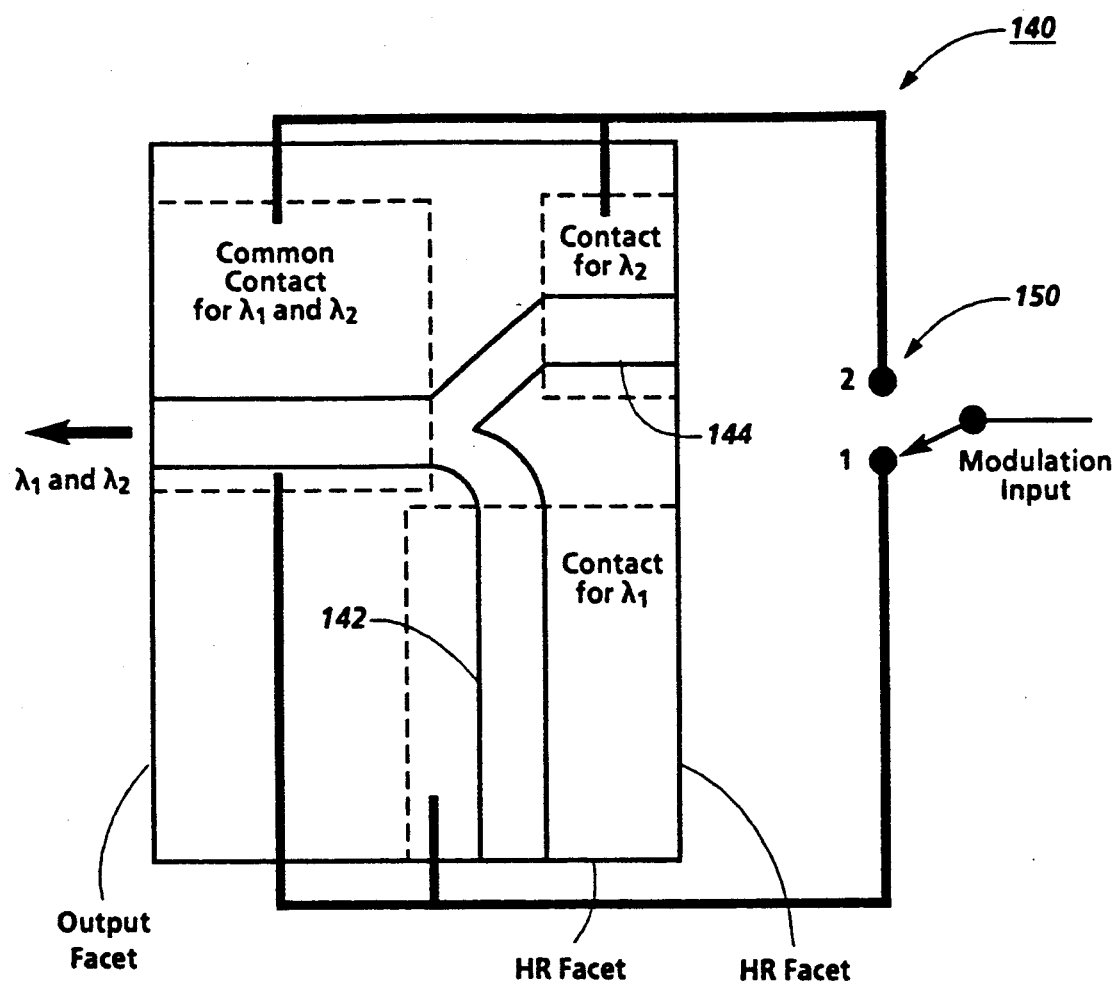

Alternate embodiments for switching the wavelength of lasing emission from MQW structures formed according to this invention are shown in FIGS. 12a, 12b, and 12c. FIG. 12a shows a laser 120 whose cavity is bifurcated into two laterally separated waveguides 122 and 124 with different optical loss. Different levels of optical loss can be achieved from each waveguide, for example, by narrowing the width of one active waveguide 126 relative to the other active waveguide 128.

Alternatively, different levels of optical loss can be achieved in each waveguide 132 and 134 of a laser apparatus 130 by appropriate design of the coupling region, as illustrated in FIG. 12b. In this case, region 134 is optically coupled to a gain region 105 by a waveguide region 107, while region 132 is only evanescently coupled to gain region 105. The increased loss introduced by the evanescent coupling between the offset laser waveguides 132 and 134 causes lasing on the offset path from waveguide 132 to occur at the short wavelength $\lambda_2$.

Alternatively, two waveguides 142 and 144 of a laser apparatus 140 can be made with different lengths as shown in FIG. 12c. Because the longer waveguide 142 has more total gain than the shorter waveguide 144 it will lase on the long wavelength transition $\lambda_1$.

Lasing at $\lambda_1$ is obtained in each of the embodiments of FIGS. 12a, 12b, and 12c by applying current to the structure with the switch 150 of the various embodiments in position 1. In this position, no current is applied to the contact for $\lambda_2$ and consequently no lasing occurs in this region since it is highly absorptive. The lasing wavelength is switched from $\lambda_1$ to $\lambda_2$ by applying increased current through the switch in position 2. In this position, no current is applied to the contact for $\lambda_1$, and consequently lasing at $\lambda_1$ is suppressed since this region is highly absorptive.

Coaxial emission of light at $\lambda_1$ and $\lambda_2$ is obtained from the indicated output facet since this portion of the laser cavity is common to the optical path of each waveguide. These structures are advantaged over the linear waveguides of FIG. 10 in that they require only one source of current which is switched between two terminals, whereas the structure of FIG. 10 requires two sources of current which are independently modulated.

Figure 13:
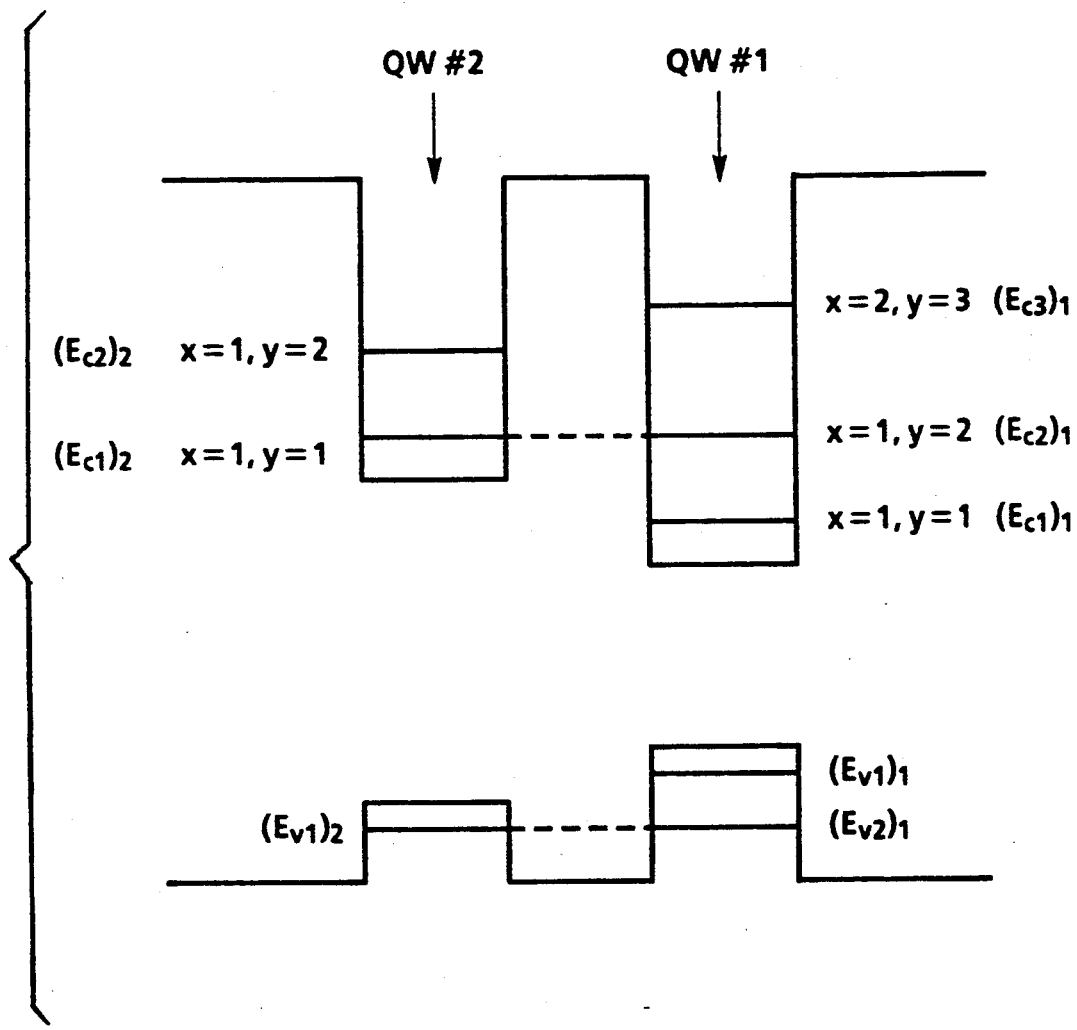
FIG. 13 is a schematic illustration of a configuration of an active layer having regions of carrier quantization in two dimensions, showing the labelling of the energy bands, according to this invention.

The present invention extends to structures having regions of carrier quantization in two dimensions ("quantum wires"). In these cases, the regions of quantization may be designated by two quantum numbers, for example x and y, the present invention being realized where at least one of the quantum numbers differs as between two regions with aligned energy bands. This is shown in FIG. 13. Equivalently, the present invention may be extended to structures having regions of carrier quantization in three dimensions ("quantum wires") such as those structures disclosed by Stern et al., in *Fabrication of 20-nm Structures in GaAs*, Appl. Phys. Lett., vol. 45, no. 4, p. 410 (1984) and Scherer et al., in *Fabrication of Microlasers and Microresonator Optical Switches*, Appl. Phys. Lett., vol. 55, no. 26, p. 2724 (1989). In these cases the regions of carrier quantization may be designated by three quantum numbers, again, at least one of the quantum numbers must will be different as between two regions with aligned energy bands.

Furthermore, there may be multiple regions of carrier quantization in an active layer. For example, the double quantum wire structure of Simhony et al., disclosed in *Double Quantum Wire GaAs/AlGaAs Diode Lasers Grown By Organometallic Chemical Vapor Deposition On Grooved Substrates*, IEEE Phot. Tech. Lett., vol. 2, no. 5, p. 305 (1990), may be configured to have energy band alignment according to the present invention. Also, regions of carrier quantization may lie in different planes of the device. For example, the stacked quantum wires disclosed in U.S. Pat. No. 5,138,625, may also be configured to have energy band alignment according to the present invention.

In general, to those skilled in the art to which this invention relates, many changes in construction and widely differing embodiments and applications of the present invention will suggest themselves without departing from its spirit and scope. Thus, the disclosures and descriptions herein are illustrative, and are not intended to be in any sense limiting.

What is claimed is:

1. A solid state semiconductor laser switchable between at least two different output wavelengths, comprising:

a laser body of the type including a plurality of contiguous layers of semiconductor material, located in an optical path, at least first and second portions of said layers of the type providing carrier quantization in at least one dimension, wherein said first and second portions are formed such that one quantum level of said first portion is at the same energy level as a different quantum level of said second portion;

means for providing gain in said optical path when an electrical bias is applied thereto;

means for providing loss in said optical path when an electrical bias is applied thereto to thereby limit the output of said laser to a first wavelength which corresponds to an energy level of said first portion which is not found in said second portion when a first electrical bias is applied thereto, and to thereby limit the output of said laser to a second wavelength different than said first wavelength which corresponds to an energy level found in both said first and second portions when a second electrical bias, different than said first electrical bias, is applied thereto.

2. A solid state semiconductor laser switchable between at least two different output wavelengths, comprising:

a laser body of the type including a plurality of contiguous layers of semiconductor material, located in an optical path, at least a first and second portions of said layers of the type providing carrier quantization in at least one dimension, wherein said first and second portions thereof are formed such that one quantum level of said first portion is at the same energy level as a different quantum level of said second portion;

means for providing gain in said optical path when an electrical bias is applied thereto;

first loss means for providing loss in said optical path when an electrical bias is applied thereto to thereby limit the output of said laser to a first wavelength which corresponds to an energy level of said first portion which is not found in said second portion, second loss means for providing loss in said optical path when an electrical bias is applied thereto to thereby limit the output of said laser to a second wavelength different than said first wavelength which corresponds to an energy level found in both said first and second portion.

3. The laser of claim 2, further including means for switching an electrical bias such that said bias is applied either to said first loss means or said second loss means, to thereby cause said laser to emit an output at either a first or a second wavelength.

4. The laser of claim 2, wherein said first loss means comprises a waveguide of a first width, and said second loss means comprises a waveguide of a second width different than said first width.

5. The laser of claim 2, wherein said first loss means comprises a waveguide of a first length, and said second loss means comprises a waveguide of a second length different than said first length.

6. The laser of claim 2, wherein said means for providing gain and said first loss means are coupled by an optical waveguide, and said means for providing gain and said second loss means are not coupled by an optical waveguide.

* * * * *